(12) United States Patent
Fujita et al.

(10) Patent No.: US 6,517,987 B2
(45) Date of Patent: Feb. 11, 2003

(54) POSITIVE-WORKING PRESENSITIZED PLATE USEFUL FOR PREPARING A LITHOGRAPHIC PRINTING PLATE

(75) Inventors: Kazuo Fujita, Shizuoka-ken (JP); Shiro Tan, Shizuoka-ken (JP); Akira Nagashima, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 133 days.

(21) Appl. No.: 09/811,425

(22) Filed: Mar. 20, 2001

(65) Prior Publication Data

US 2001/0041299 A1 Nov. 15, 2001

(30) Foreign Application Priority Data

Mar. 22, 2000 (JP) ......................... 2000-079611

(51) Int. Cl.$^7$ ................................ G03F 7/023; G03F 7/30; G03F 7/11
(52) U.S. Cl. ........................ 430/165; 430/191; 430/192; 430/193; 430/190; 430/302; 430/166
(58) Field of Search ................ 430/165, 191, 430/192, 193, 302

(56) References Cited

U.S. PATENT DOCUMENTS

| | | | | |
|---|---|---|---|---|
| 4,898,803 A | * | 2/1990 | Aoai et al. | 430/166 |
| 4,950,582 A | * | 8/1990 | Aoai et al. | 430/155 |
| 5,254,432 A | * | 10/1993 | Aoai | 430/165 |
| 5,362,599 A | * | 11/1994 | Knors et al. | 430/165 |
| 5,670,293 A | * | 9/1997 | Naruse et al. | 427/289 |
| 5,731,127 A | * | 3/1998 | Ishizuka et al. | 430/165 |
| 6,190,825 B1 | * | 2/2001 | Denzinger et al. | 430/165 |
| 6,391,513 B1 | * | 5/2002 | Susukida et al. | 430/190 |
| 6,423,467 B1 | * | 7/2002 | Kawauchi et al. | 430/176 |

* cited by examiner

Primary Examiner—John S. Chu
(74) Attorney, Agent, or Firm—Burns, Doane, Swecker & Mathis, LLP

(57) ABSTRACT

The present invention relates to a positiive-working presensitized plate useful for preparing a lithographic printing plate comprising a positive-working photosensitive composition comprising at least one ester of 1,2-naphthoquinone-2-diazide-5-sulfonic acid, at least one ester of 1,2-naphthoquinone-2-diazide-4-sulfonic acid, and at least one polymer which is insoluble in water and soluble in an aqueous alkaline solution and which comprises at least one group or bond selected from sulfonamide group, urea bond or urethane bond. A lithographic printing plate prepared from the presensitized plate of the present invention shows improvement of chemical-resistance and printing durability, and good sensitivity, coupling property, adaptability to ball-point pen, shelf stability, and stability of sensitivity with time after exposure.

8 Claims, No Drawings

POSITIVE-WORKING PRESENSITIZED PLATE USEFUL FOR PREPARING A LITHOGRAPHIC PRINTING PLATE

BACKGROUND OF THE INVENTION

The present invention relates to a positive-working presensitized plate useful for preparing a lithographic printing plate comprising a positive-working photosensitive composition coated on a substrate, which the composition comprises a positive-working photosensitive compound and a specific polymer.

A photosensitive composition comprising o-naphthoquinonediazide compound and a novolak-type phenol resin has been industrially utilized for the preparation of lithographic printing plate or photoresist as a useful photosensitive composition.

However, the novolak-type phenol resin mainly used for the photosensitive composition has many defects, for example, poor adhesion to the substrate, brittleness of the film made of the resin, poor application property, poor abrasiveness, insufficient durability during printing and poor chemical-resistant. Particularly when it is used with UV ink, the durability becomes insufficient.

In order to improve these properties, the presensitized plate is generally subjected to burning treatment (that is, to heat the plate after light exposure and development). However, such burning treatment causes another problem. That is, it causes contamination on prints because low molecular compounds are sublimated from photosensitive layer of an image area to adhere to a non-image area.

To solve the problem, a number of polymers are studied as a binder for the photosensitive composition. For example, it has been proposed to use the following compounds as a binder; polyhydroxystyrene or hydroxystyrene copolymer described in Japanese Patent Publication for Opposition Purpose (hereunder referred to as "J.P. KOKOKU") No. Sho 52-41050, or a polymer comprising a structural unit derived from acrylic acid as described in Japanese Patent Unexamined Publication (hereunder referred to as "J.P. KOKAI") No. Sho 51-34711. In addition, it has been proposed to use the following compounds as a binder; a polymer comprising a sulfonamide group as described in J.P. KOKAI No. Hei 2-866, polymers comprising a group derived from acrylic acid with phenolic hydroxy group as described in J.P. KOKAI Nos. Sho 63-89864, Hei 1-35436, Hei 1-52139, and Hei 8-339082. However, lithographic printing plates using such polymers often show narrow development latitude.

In addition, when the positive-working presensitized plate useful for preparing a lithographic printing plate having o-naphthoquinonediazide compound as a photosensitive compound is developed with an alkaline developer containing water as a main solvent, sometimes red-colored material is formed at halftone of image area. This phenomenon is a result of a coupling reaction between decomposed material of o-naphthoquinonediazide and unreacted compound. If the red-corolred material remains on the substrate, it is difficult to delete the image area, i.e., the workability to remove insoluble image becomes deteriorated.

In addition, when multiple images are formed (that is, when images are formed using plural imaging films) on a presensitized plate for lithographic printing plate at various positions, the position of each film is marked on the photosensitive layer to register the positions of the films using an oil-base ball-point pen. Solvent used in ink for the ball-point pen sometimes erodes and resolves the photosensitive layer. Especially when the mark is present on image area, the marked portion on the photosensitive layer will be removed after development and thus, the mark would be printed out. Therefore, there is a need for a photosenstive composition having a resistance to erosion by ink of ball-point pen (hereinafter, this property will be referred to as "adaptability to ball-point pen").

Generally, a lithographic printing plate is prepared by exposing a presensitized plate having a photosensitive layer on which image film is overlapped and by developing thus exposed plate. In such preparation process for the lithographic printing plate, time between the exposure and the development is not constant. Sometimes, the development is conducted several days after the exposure. The sensitivity of the plate varies with time after the exposure. Therefore, sometimes it causes a problem that a normal printing material can not be obtained.

In addition, many of these photosensitive materials have defaults such as short lifetime and low sensitivity to active lights. Thus, these compounds do not show sufficient properties.

SUMMARY OF THE INVENTION

An object of the present invention is to provide a positive-working presensitized plate useful for preparing a lithographic printing plate which shows wide latitude in development, good printing durability, chemical-resistant, coupling property, adaptability to ball-point pen, sensitivity, shelf stability, as well as small change of sensitivity with time after exposure.

The inventors of the present invention found that the above-described problems can be solved by the positive-working presensitized plate useful for preparing a lithographic plate comprising a positive-working photosensitive composition coated on a substrate, which the composition comprises (a) at least one ester of 1,2-naphthoquinone-2-diazide-5-sulfonic acid, (b) at least one ester of 1,2-naphthoquinone-2-diazide-4-sulfonic acid, and (c) at least one polymer that is insoluble in water and soluble in an aqueous alkaline solution and that comprises at least one sulfonamide group, or by the positive-working presensitized plate useful for preparing a lithographic printing plate comprising a positive-working photosensitive composition coated on a substrate, which the composition comprises (a) at least one ester of 1,2-naphthoquinone-2-diazide-5-sulfonic acid, (b) at least one ester of 1,2-naphthoquinone-2-diazide-4-sulfonic acid, and (c) at least one polymer which is insoluble in water and soluble in an aqueous alkaline solution and which comprises at least one urea bond or urethane bond, to thus complete the present invention.

Namely, the positiive-working presensitized plate useful for preparing a lithographic printing plate comprising a positive-working photosensitive composition comprising at least one ester of 1,2-naphthoquinone-2-diazide-5-sulfonic acid, at least one ester of 1,2-naphthoquinone-2-diazide-4-sulfonic acid, and at least one polymer which is insoluble in water and soluble in an aqueous alkaline solution and which comprises at least one group or bond selected from sulfonamide group, urea bond or urethane bond, would result in improvement of chemical-resistance and printing durability, and good sensitivity, coupling property, adaptability to ball-point pen, shelf stability, and stability of sensitivity with time after exposure.

DESCRIPTION OF THE PREFERRED EMBODIMENTS

The details of the present inveniton will be described below. The positive-working presensitized plate for making a lithographic printing plate of the present invention can be prepared by applying on a substrate that has been subjected to hydrophilization treatment, a photosensitive layer comprised of positive-working photosensitive composition comprising (a) at least one ester of 1,2-naphthoquinone-2-diazide-5-sulfonic acid, (b) at least one ester of 1,2-naphthoquinone-2-diazide-4-sulfonic acid and (c) at least one polymer that is insoluble in water and soluble in an aqueous alkaline solution and that comprises at least one group or bond selected from the group consisting of sulfonamide group, urea bond and urethane bond.

(Photosensitive Compound)

Ester of 1,2-naphthoquinone-2-diazide-5-sulfonic acid, and ester of 1,2-naphthoquinone-2-diazide-4-sulfonic acid Examples of the esters of 1,2-naphthoquinone-2-diazide-5-sulfonic acid and ester of 1,2-naphthoquinone-2-diazide-4-sulfonic acid include a variety of known compounds comprising 1,2-naphthoquinonediazide group. Especially preferred compounds are esters of a variety of hydroxy compounds and 1,2-naphthoquinonediazidesulfonic acids. Examples of such hydroxy compound include phenols such as phenol, resorcin, cresol, pyrogallol, and condensation product thereof with a carbonyl group-containing compound such as aldehydes (e.g. formaldehyde) and ketones (e.g. acetone).

More specifically, preferred compound is a reaction product of 1,2-naphthoquinone-2-diazide-5-sulfonyl chloride or 1,2-naphthoquinone-2-diazide-4-sulfonyl chloride with condensation resin of phenols/aldehydes or ketones, preferably pyrogallol/acetone resin. Examples of such condensation resin include condensation product of pyrogallol and acetone as described in U.S. Pat. No. 3,635,709, and phenol/formaldehyde resins and cresol/formaldehyde resins as described in U.S. Pat. No. 3,046,120.

Other useful naphthoquinonediazide compounds include those reported in many patents, e.g., J.P. KOKAI Nos. Sho 47-5303, Sho 48-63802, Sho 48-63803, Sho 48-96575, Sho 49-38701, Sho 48-13354, J.P. KOKOKU Nos. Sho 37-18015, Sho 41-11222, Sho 45-9610, Sho 49-17481, U.S. Pat. Nos. 2,797,213, 3,454,400, 3,544,323, 3,573,917, 3,674,495, 3,785,825, British Patent Nos. 1,227,602, 1,251,345, 1,267,005, 1,329,888, 1,330,932, and German Patent No. 854,890.

It is also possible to use 1,2-naphthoquinonediazide compound that is prepared by reacting hydroxy compund having molecular weight of 1000 or less with 1,2-naphthoquinone-2-diazidesulfonyl chloride. Examples of such compound include those described in J.P. KOKAI Nos. Sho 51-139402, Sho 58-150948, Sho 58-203434, Sho 59-165053, Sho 60-121445, Sho 60-134235, Sho 60-163043, Sho 61-118744, Sho 62-10645, Sho 62-10646, Sho 62-153950, Sho 62-178562, Sho 64-76047, U.S. Pat. Nos. 3,102,809, 3,126,281, 3,130,047, 3,148,983, 3,184,310, 3,188,210, and 4,639,406.

In addition, it is also possible to use an ester of 1,2-naphthoquinone-2-diazidesulfonic acid comprising a structural unit with specific atoms as described in J.P. KOKAI Nos. Hei 4-345164, Hei 10-198030, Hei 11-143066, Hei 11-242325 and the like.

In the preparation of these 1,2-naphthoquinone-2-diazide compounds, it is preferred to use 0.2 to 1.2 equivalent and more preferably 0.3 to 1.0 equivalent of 1,2-naphthoquinone-2-diazidesulfonyl chloride based on hydroxy group of hydroxy compound. 1,2-Naphthoquinone-2-diazide-5-sulfonyl chloride and 1,2-naphthoquinone-2-diazide-4-sulfonyl chloride can be used as 1,2-naphthoquinone-2-diazidesulfonyl chloride and may be used alone or as a mixture thereof in a specific ratio. In addition, the same or different hydroxy compounds may be used for preparation of ester of 1,2-naphthoquinone-2-diazide-5-sulfonic acid and ester of 1,2-naphthoquinone-2-diazide-4-sulfonic acid. Further, a mixture of two or more esters may be used as ester of 1,2-naphthoquinone-2-diazide-5-sulfonic acid or ester of 1,2-naphthoquinone-2-diazide-4-sulfonic acid. The total amount of 1,2-naphthoquinonediazide compound in the photosensitive composition of the present invention may be 10% to 50% by weight and more preferably from 15% to 40% by weight, based on the total weight of solid portion of the photosensitive composition.

A ratio of the ester of 1,2-naphthoquinone-2-diazide-5-sulfonic acid and the ester of 1,2-naphthoquinone-2-diazide-4-sulfonic acid in the photosensitive composition of the present invention may be 5/95~95/5. If the amount of ester of 1,2-naphthoquinone-2-diazide-5-sulfonic acid is less than 5% by weight, the sensitivity of the plate would vary largely with time after exposure. Also, if the amount of ester of 1,2-naphthoquinone-2-diazide-4-sulfonic acid is less than 5% by weight, coupling property and adaptibility to ball-point pen would be deteriorated. More preferably, the ratio ranges from 20/80~80/20.

(Polymer Compound)

The photosensitive composition of the present invention contains, as a binder, a polymer which is insoluble in water and soluble in an aqueous alkaline solution and which comprises at least one sulfonamide group, or a polymer which is insoluble in water and soluble in an aqueous alkaline solution and which comprises at least one urea bond or urethane bond.

The polymer which is insoluble in water and soluble in an aqueous alkaline solution and which comprises at least one sulfonamide group usable in the photosensitive composition of the present invention is preferably a polymer having at least one —SO$_2$—NH— bond on the main or side chain and more preferably, a polymer having at least one —SO$_2$—NH— bond on the side chain.

The polymer which is insoluble in water and soluble in an aqueous alkaline solution and which comprises at least one sulfonamide group usable in the photosensitive composition of the present invention can be prepared by polymerizing a low molecular compound having at least one polymerizable unsaturated bond and at least one sulfonamide group wherein at least one H atom is bound on at least one N atom, in the presence of known initiator for polymerization in a suitable solvent. The low molecular compound preferably used in the present invention includes the compounds represented by the general formulas (Ia) to (Ie) (it is also referred to as general formula (I));

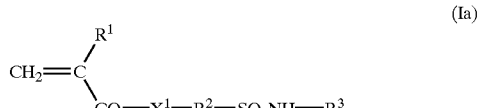

(Ia)

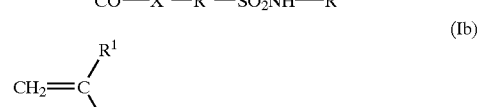

(Ib)

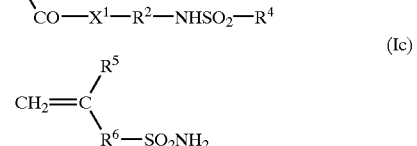

(Ic)

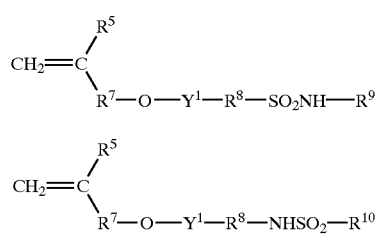

(Id)

(Ie)

[wherein, $X^1$ represents —O— or —NR—; $R^1$ represents —H or —CH$_3$; $R^2$ represents optionally substituted $C_1$~$C_{12}$ alkylene, cycloalkylene, arylene or aralkylene group; $R^3$ represents hydrogen atom, or optionally substituted $C_1$~$C_{12}$ alkyl, cycloalkyl, aryl or aralkyl group; $R^4$ represents optionally substituted $C_1$~$C_{12}$ alkyl, cycloalkyl, aryl or aralkyl group; R represents hydrogen atom, or optionally substituted $C_1$~$C_{12}$ alkyl, cycloalkyl, aryl or aralkyl group; $Y^1$ represents single bond or —CO—; $R^5$ represents hydrogen atom, halogen atom or methyl group; $R^6$ represents optionally substituted $C_1$~$C_{12}$ alkylene, cycloalkylene, arylene or aralkylene group; $R^7$ represents single bond or optionally substituted $C_1$~$C_{12}$ alkylene, cycloalkylene, arylene or aralkylene group; $R^8$ represents optionally substituted $C_1$~$C_{12}$ alkylene, cycloalkylene, arylene or aralkylene group; $R^9$ represents hydrogen atom, or optionally substituted $C_1$~$C_{12}$ alkyl, cycloalkyl, aryl or aralkyl group; $R^{10}$ represents optionally substituted $C_1$~$C_{12}$ alkyl, cycloalkyl, aryl or aralkyl group.]

In the above definition, "$C_1$~$C_{12}$ alkylene, cycloalkylene, arylene or aralkylene group" or "$C_1$~$C_{12}$ alkyl, cycloalkyl, aryl or aralkyl group" means alkylene, cycloalkylene, arylene, aralkylene, alkyl, cycloalkyl, aryl or aralkyl group each having 12 or less carbon atoms. Thus, for example, "$C_1$~$C_{12}$ cycloalkylene" substantially means $C_3$~$C_{12}$ cycloalkylene such as cyclopropylene, cyclobutylene and the like.

Among the compounds represented by the general formulas (Ia) and (Ib), preferred are those in which $R^2$ represents $C_2$~$C_6$ alkylene, $C_3$~$C_6$ cycloalkylene, optionally substituted phenylene, or naphthylene group, $R^3$ represents H or $C_1$~$C_6$ alkyl, $C_3$~$C_6$ cycloalkyl or optionally substituted phenyl, or naphthyl group, $R^4$ represents $C_1$~$C_6$ alkyl, $C_3$~$C_6$ cycloalkyl or optionally substituted phenyl, or naphthyl group, and R represents hydrogen atom.

In the above definitions for compounds (Ia) and (Ib), optional substituents on each group may be selected from halogen atom, $C_1$~$C_6$ alkyl, $C_3$~$C_6$ cycloalkyl, phenyl and naphthyl group.

Specific examples of such low molecular compound include methacrylamides such as N-(o-aminosulfonylphenyl)methacrylamide, N-(m-aminosulfonylphenyl)methacrylamide, N-(p-aminosulfonylphenyl)methacrylamide, N-(o-methylaminosulfonylphenyl)methacrylamide, N-(m-methylaminosulfonylphenyl)methacrylamide, N-(p-methylaminosulfonylphenyl)methacrylamide, N-(o-ethylaminosulfonylphenyl)methacrylamide, N-(m-ethylaminosulfonylphenyl)methacrylamide, N-p-ethylaminosulfonylphenyl)methacrylamide, N-(o-n-propylaminosulfonylphenyl)methacrylamide, N-(m-n-propylaminosulfonylphenyl)methacrylamide, N-(p-n-propylaminosulfonylphenyl)methacrylamide, N-(o-i-propylaminosulfonylphenyl)methacrylamide, N-(m-i-propylaminosulfonylphenyl)methacrylamide, N(p-i-propylaminosulfonylphenyl)methacrylamide, N-(o-n-butylaminosulfonylphenyl)methacrylamide, N-(m-n-butylaminosulfonylphenyl)methacrylamide, N-(p-n-butylaminosulfonylphenyl)methacrylamide, N-(o-i-butylaminosulfonylphenyl)methacrylamide, N-(m-i-butylaminosulfonylphenyl)methacrylamide, N-(p-i-butylaminosulfonylphenyl)methacrylamide, N-(o-sec-butylaminosulfonylphenyl)methacrylamide, N-(m-sec-butylaminosulfonylphenyl)methacrylamide, N-(p-sec-butylaminosulfonylphenyl)methacrylamide, N-(o-t-butylaminosulfonylphenyl)methacrylamide, N-(m-t-butylaminosulfonylphenyl)methacrylamide, N-(p-t-butylaminosulfonylphenyl)methacrylamide, N-(o-phenylaminosulfonylphenyl)methacrylamide, N-(m-phenylaminosulfonylphenyl)methacrylamide, N-(p-phenylaminosulfonylphenyl)methacrylamide, N-(o-(α-naphthylaminosulfonyl)phenyl)methacrylamide, N-(m-(α-naphthylaminosulfonyl)phenyl)methacrylamide, N-(p-(α-naphthylaminosulfonyl)phenyl)methacrylamide, N-(o-(β-naphthylaminosulfonyl)phenyl)methacrylamide, N-(m-(β-naphthylaminosulfonyl)phenyl)methacrylamide, N-(p-(β-naphthylaminosulfonyl)phenyl)methacrylamide, N-(1-(3-aminosulfonyl)naphthyl)methacrylamide, N-(1-(3-methylaminosulfonyl)naphthyl)methacrylamide, N-(1-(3-ethylaminosulfonyl)naphthyl)methacrylamide, N-(o-methylsulfonylaminophenyl)methacrylamide, N-(m-methylsulfonylaminophenyl)mnethacrylamide, N-(p-methylsulfonylaminophenyl)methacrylamide, N-(o-ethylsulfonylaminophenyl)methacrylamide, N-(m-ethylsulfonylaminophenyl)methacrylamide, N-(p-ethylsulfonylaminophenyl)methacrylamide, N-(o-phenylsulfonylaminophenyl)methacrylamide, N-(m-phenylsulfonylaminophenyl)methacrylamide, N-(p-phenylsulfonylaminophenyl)methacrylamide, N-(o-(p-methylphenylsulfonylamino)phenyl)methacrylamide, N-(m-(p-methylphenylsulfonylamino)phenyl)methacrylamide, N-(p-p-methylphenylsulfonylamino)phenyl)methacrylamide, N-(p-(α-naphthylsulfonylamino)phenylmethacrylamide, N-(p-(β-naphthylsulfonylamino)phenyl)methacrylamide, N-(2-methylsulfonylaminoethyl)methacrylamide, N-(2-ethylsulfonylaminoethyl)methacrylamide, N-(2-phenylsulfonylaminoethyl)methacrylamide, N-(2-p-methylphenylsulfonylaminoethyl)methacrylamide, N-(2-α-naphthylsulfonylaminoethyl)methacrylamide, N-(2-β-naphthylsulfonylamino)ethylmethacrylamide and the like, acrylamides such as those having the same substituents as described above, methacrylic acid esters such as o-aminosulfonylphenyl methacrylate, m-aminosulfonylphenyl methacrylate, p-aminosulfonylphenyl methacrylate, o-methylaminosulfonylphenyl methacrylate, m-methylaminosulfonylphenyl methacrylate, p-methylaminosulfonylphenyl methacrylate, o-ethylaminosulfonylphenyl methacrylate, m-ethylaminosulfonylphenyl methacrylate, p-ethylaminosulfonylphenyl methacrylate, o-n-propylaminosulfonylphenyl methacrylate, m-n-propylaminosulfonylphenyl methacrylate, p-n-propylaminosulfonylphenyl methacrylate, o-i-propylaminosulfonylphenyl methacrylate, m-i-propylaminosulfonylphenyl methacrylate, o-n-butylaminosulfonylphenyl methacrylate, m-n-butylaminosulfonylphenyl methacrylate, p-n-butylaminosulfonylphenyl methacrylate, m-i-butylaminosulfonylphenyl methacrylate, p-i-butylaminosulfonylphenyl methacrylate, m-sec-butylaminosulfonylphenyl methacrylate, p-sec-butylaminosulfonylphenyl methacrylate, m-t- butylaminosulfonylphenyl methacrylate, p-t-butylaminosulfonylphenyl methacrylate, o-phenylaminosulfonylphenyl methacrylate, m-phenylaminosulfonylphenyl methacrylate, p-phenylaminosulfonylphenyl methacrylate, m-(α-naphthylaminosulfonyl)phenyl methacrylate, p-(α-naphthylaminosulfonylphenyl)methacrylate, m-(β-naphthylaminosulfonyl)phenyl methacrylate, p-(β-naphthylaminosulfonyl)phenyl methacrylate, 1-(3-aminosulfonyl)naphthyl methacrylate, 1-(3-methylaminosulfonyl)naphthyl methacrylate, 1-(3-ethylaminosulfonyl)naphthyl methacrylate, o-methylsulfonylaminophenyl methacrylate, m-methylsulfonylaminophenyl methacrylate, p-methylsulfonylaminophenyl methacrylate, o-ethylsulfonylaminophenyl methacrylate, m-ethylsulfonylaminophenyl methacrylate, p-ethylsulfonylaminophenyl methacrylate, o-phenylsulfonylaminophenyl methacrylate, m-phenylsulfonylaminophenyl methacrylate, p-phenylsulfonylaminophenyl methacrylate, o-(p-methylphenylsulfonylamino)phenyl methacrylate, m-(p-methylphenylsulfonylamino)phenyl methacrylate, p-(p-methylphenylsulfonylamino)phenyl methacrylate, p-(α-naphthylsulfonylamino)phenyl methacrylate, p-(β-naphthylsulfonylamino)phenyl methacrylate, 2-methylsulfonylaminoethyl methacrylate, 2-ethylsulfonylaminoethyl methacrylate, 2-phenylsulfonylaminoethyl methacrylate, 2-p-methylphenylsulfonylaminoethyl methacrylate, 2-α-naphthylsulfonylaminoethyl methacrylate, 2-β-naphthylsulfonylaminoethyl methacrylate and the like, and acrylic acid esters such as those having the same substituents as described above.

Further, preferred examples of substituents in the low molecular compounds represented by general formulas (Ic)~(Ie) are the following ones; $R^5$ is hydrogen atom, $R^6$ is optionally substituted methylene, phenylene, or naphthylene group, $R^7$ is single bond or methylene group, $R^8$ is $C_1\sim C_6$ alkylene group or optionally substituted phenylene or naphthylene group, $R^9$ is hydrogen atom, or $C_1\sim C_6$ alkyl, $C_3\sim C_6$ cycloalkyl, optionally substituted phenyl, or naphthyl group, and $R^{10}$ is $C_1\sim C_6$ alkyl, $C_3\sim C_6$ cycloalkyl, optionally substituted phenyl or naphthyl group.

In the above definitions for compounds (Ic) to (Ie), optional substituents on each group may be selected from halogen atom, $C_1\sim C_6$ alkyl, $C_3\sim C_6$ cycloalkyl, phenyl and naphthyl group.

Specific examples of such compounds of general formulas (Ic)~(Ie) include p-aminosulfonylstyrene, p-aminosulfonyl-α-methylstyrene, p-aminosulfonylphenyl allyl ether, p-(N-methylaminosulfonyl)phenyl allyl ether, vinyl methylsulfonylaminoacetate, vinyl phenylsulfonylaminoacetate, allyl methylsulfonylaminoacetate, allyl phenylsulfonylaminoacetate, p-methylsulfonylaminophenyl allyl ether and the like.

Hereinafter, a polymer having at least one urea bond or urethane bond on the side chain will be described. The polymer having at least one urea bond or urethane bond on the side chain usable in the present invention includes various compounds and preferably a polymer comprising at least one repeating unit represented by the following general formulas (IIa)~(IIc) (it is also referred to as general formula (II)).

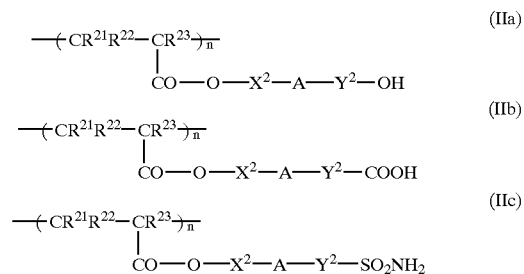

In the above formulas (IIa)~(IIc), the following definition is used; $R^{21}$ and $R^{22}$ each independently represents hydrogen atom, halogen atom, alkyl, aryl, or carboxyl group or salts thereof, $R^{23}$ represents hydrogen atom, halogen atom, alkyl or aryl group, "A" represents —NHCONH—, —NHCOO—, or —OCONH—, $X^2$ represents bivalent connecting group, $Y^2$ represents optionally substituted bivalent aromatic group.

In the above definition, preferably alkyl is $C_1\sim C_{12}$ alkyl and aryl is optionally substituted phenyl or naphthyl group.

Examples of $X^2$ include optionally substituted $C_1\sim C_{12}$ alkylene or optionally substituted phenylene group. Examples of $Y^2$ include optionally substituted phenylene or optionally substituted naphthylene group.

In the above definitions for structures (IIa) to (IIc), optional substituents on each group may be selected from halogen atom, $C_1\sim C_6$ alkyl, $C_3\sim C_6$ cycloalkyl, phenyl and naphthyl group.

The resin comprising the structure of general formula (II) can be prepared by a variety of methods. For example, it can be prepared by polymerizing a polymerizable monomer having at least one urea bond or at least one urethane bond and at least one polymerizable unsaturated bond using a known initiator for polymerization in a suitable solvent.

The polymerizable monomer having at least one of urea bond or urethane bond and at least one of polymerizable unsaturated bond can be prepared by the following methods.

The polymerizable monomer comprising at least one urea bond or urethane bond and at least one polymerizable unsaturated bond in a molecule can be prepared by reacting isocyanate compound represented by the following general formula (A) with amine compound or alcohol compound represented by general formula (B) or (C).

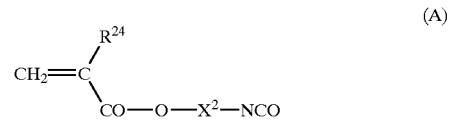

[wherein, $R^{24}$ represents hydrogen atom or alkyl group, $X^2$ represents bivalent connecting group].

Specific examples of $X^2$ include optionally substituted alkylene or optionally substituted phenylene group.

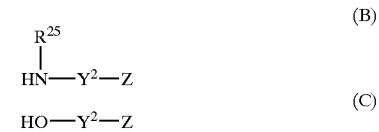

[$R^{25}$ represents hydrogen atom, or optionally substituted alkyl group, $Y^2$ represents optionally substituted bivalent aromatic group, Z represents hydroxy, carboxyl, or sulfonamide group].

Specific examples of $Y^2$ include optionally substituted phenylene or optionally substituted naphthylene group.

The polymerizable monomer represented by (D) can be obtained by conducting the above-described reaction using the compound of general formula (A) and the compound of general formula (B) or (C), wherein $X^2$ represents alkylene group, $Y^2$ represents optionally substituted phenylene or naphthylene group, Z represents hydroxy group, and $R^{25}$ represents hydrogen atom.

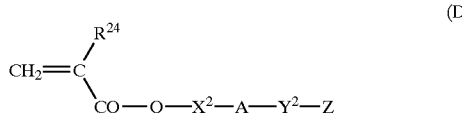

(D)

[wherein, $R^{24}$ represents hydrogen atom or alkyl group, $X^2$ represents bivalent connecting group, $Y^2$ represents optionally substituted bivalent aromatic group, A represents —NHCONH—, —NHCOO—, or —OCONH—]

Since amino group has relatively higher reactivity to isocyanate group than that of hydroxy group, carboxyl group, sulfonamide group, or —NH—CO— group, the monomer represented by formula (D-1) can be easily obtained using amino compound such as (B). Also, it is effective to conduct the above-described reaction at the temperature ranging from about 0~40° C., or by adding isocyanate compound (A) portion-wise to an excess amount of amine compound (B).

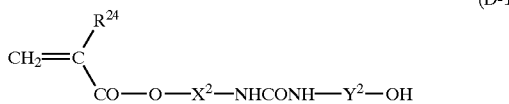

(D-1)

Thus obtained monomer (D-1) can be identified by determining absorption spectrum of infrared radiation since the compound shows specific absorption spectrum at 1600 to 1700 cm$^{-1}$ which is characteristic absorption of urea bond. Also, it is possible to identify the compound by determining melting point, proton NMR spectrum, etc., of the compound.

For the reaction described above, conventional organic solvents described below can be utilized and solvents having no active hydrogen atom are preferably used. The reaction can be stopped when isocyanate group can not be detected or the amount of urea bond becomes constant. Usually, the reaction would be completed within 15 minutes to 24 hours.

Thus obtained reaction mixture can be used as monomer (D) without further purification. But, if necessary, it is possible to obtain a highly purified monomer (D), for example, by neutralizing the mixture by addiition of acidic compound such as diluted hydrochloric acid to form a salt of compound (B) to remove unreacted starting material (when excess of compound (B) is used) or by-product of the reaction, followed by washing, filtering and drying in vacuo.

Preferred examples of polymerizable monomer usable in the present invention include a compound represented by the above-mentioned general formula (D-1) (wherein examples of $X^2$ and $Y^2$ are as described above).

Examples of such polymerizable monomer include, for example, acrylate derivatives such as 1-(N'-(4-hydroxyphenyl)ureido)methyl acrylate, 1-(N'-(3-hydroxyphenyl)ureido)methyl acrylate, 1-(N'-(2-hydroxyphenyl)ureido)methyl acrylate, 1-(N'-(3-hydroxy-4-methylphenyl)ureido)methyl acrylate, 1-(N'-(2-hydroxy-5-methylphenyl)ureido)methyl acrylate, 1-(N'-(5-hydroxynaphthyl)ureido)methyl acrylate, 1-(N'-(2-hydroxy-5-phenylphenyl)ureido)methyl acrylate, 2-(N'-(4-hydroxyphenyl)ureido)ethyl acrylate, 2-(N'-(3-hydroxyphenyl)ureido)ethyl acrylate, 2-(N'-(2-hydroxyphenyl)ureido)ethyl acrylate, 2-(N'-(3-hydroxy-4-methylphenyl)ureido)ethyl acrylate, 2-(N'-(2-hydroxy-5-methylphenyl)ureido)ethyl acrylate, 2-(N'-(5-hydroxynaphthyl)ureido)ethyl acrylate, 2-(N'-(2-hydroxy-5-phenylphenyl)ureido)ethyl acrylate, 4-(N'-(4-hydroxyphenyl)ureido)butyl acrylate, 4-(N'-(3-hydroxyphenyl)ureido)butyl acrylate, 4-(N'-(2-hydroxyphenyl)ureido)butyl acrylate, 4-(N'-(3-hydroxy-4-methylphenyl)ureido)butyl acrylate, 4-(N'-(2-hydroxy-5-methylphenyl)ureido)butyl acrylate, 4-(N'-(5-hydroxynaphthyl)ureido)butyl acrylate, 4-(N'-(2-hydroxy-5-phenylphenyl)ureido)butyl acrylate; and methacrylate derivatives such as 1-(N'-(4-hydroxyphenyl)ureido)methyl methacrylate, 1-(N'-(3-hydroxyphenyl)ureido)methyl methacrylate, 1-(N'-(2-hydroxyphenyl)ureido)methyl methacrylate, 1-(N'-(3-hydroxy-4-methylphenyl)ureido) methyl methacrylate, 1-(N'-(2-hydroxy-5-methylphenyl) ureido)methyl methacrylate, 1-(N'-(5-hydroxynaphthyl) ureido)methyl methacrylate, 1-(N'-(2-hydroxy-5-phenylphenyl)ureido)methyl methacrylate, 2-(N'-(4-hydroxyphenyl)ureido)ethyl methacrylate, 2-(N'-(3-hydroxyphenyl)ureido)ethyl methacrylate, 2-(N'-(2-hydroxyphenyl)ureido)ethyl methacrylate, 2-(N'-(3-hydroxy-4-methylphenyl)ureido)ethyl methacrylate, 2-N'-(2-hydroxy-5-methylphenyl)ureido)ethyl methacrylate, 2-(N'-(5-hydroxynaphthyl)ureido)ethyl methacrylate, 2-(N'-(2-hydroxy-5-phenylphenyl)ureido)ethyl methacrylate, 4-(N'-(4-hydroxyphenyl)ureido)butyl methacrylate, 4-(N'-(3-hydroxyphenyl)ureido)butyl methacrylate, 4-(N'-(2-hydroxyphenyl)ureido)butyl methacrylate, 4-(N'-(3-hydroxy-4-methylphenyl)ureido)butyl methacrylate, 4-(N'-(2-hydroxy-5-methylphenyl)ureido)butyl methacrylate, 4-(N'-(5-hydroxynaphthyl)ureido)butyl methacrylate, 4-(N'-(2-hydroxy-5-phenylphenyl)ureido)butyl methacrylate.

For example, 2-(N'-(4-hydroxyphenyl)ureido)ethyl methacrylate has melting point of 131~133° C. and it can be idetified by determining the IR spectrum based on the characteristic absorption of hydroxy group and urea group described above.

Alternative examples of polymerizable monomer comprising urea bond and polymerizable unsaturated bond preferably used in the present invention include acrylates having acidic group such as 2-(N'-(4-carboxylphenyl)ureido)ethyl acrylate, 2-(N'-(4-sulfamoylphenyl)ureido)ethyl acrylate, 2-(N'-(4-sulfophenyl)ureido)ethyl acrylate, 2-(N'-(4-phosphonophenyl)ureido)ethyl acrylate: methacrylates having acidic group such as 2-(N'-(4-carboxylphenyl)ureido) ethyl methacrylate, 2-(N'-(4-sulfamoylphenyl)ureido)ethyl methacrylate, 2-(N'-(4-sulfophenyl)ureido)ethyl methacrylate, 2-(N'-(4-phosphonophenyl)ureido)ethyl methacrylate: acrylates having no acidic group such as 2-(N'-methylureido)ethyl acrylate, 2-(N'-propylureido)ethyl acrylate, 2-(N'-phenylureido)ethyl acrylate, 2-N'-(4-methylphenyl)ureido)ethyl acrylate, 2-(N'-(2-methylphenyl) ureido)ethyl acrylate, 2-(N'-naphthylureido)ethyl acrylate, 2-(N'-(2-phenylphenyl)ureido)ethyl acrylate: and methacrylates having no acidic group such as 2-(N'-methylureido) ethyl methacrylate, 2-(N'-propylureido)ethyl methacrylate, 2-(N'-phenylureido)ethyl methacrylate, 2-(N'-(4-methylphenyl)ureido)ethyl methacrylate, 2-(N'-(2-methylphenyl)ureido)ethyl methacrylate, 2-(N'-naphthylureido)ethyl methacrylate, 2-(N'-(2-phenylphenyl) ureido)ethyl methacrylate.

In this connection, 2-(N'-(4-carboxyphenyl)ureido)ethyl methacrylate is decomposed at 220° C. and can be identified by determining the IR spectra of carboxyl group and urea bond.

Alternative examples of polymerizable monomer comprising urethan bond and polymerizable unsaturated bond that is preferably usable in the present invention include the following compounds.

(M1)
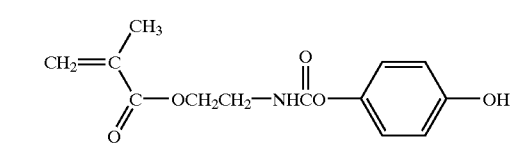

(M2)
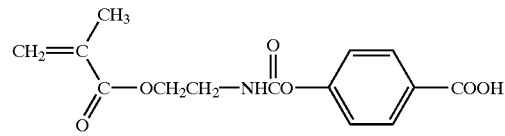

(M3)
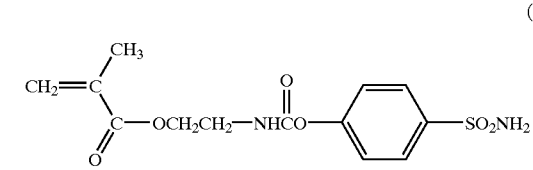

(M4)
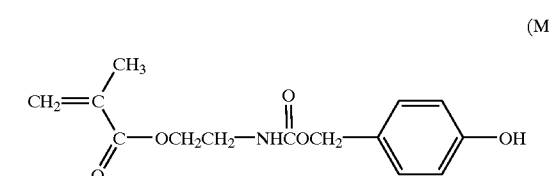

(M5)

(M6)
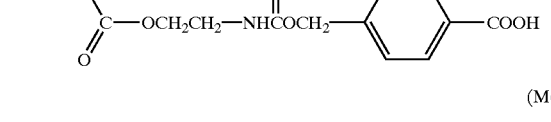

(M7)
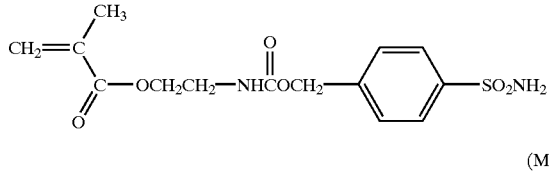

(M8)
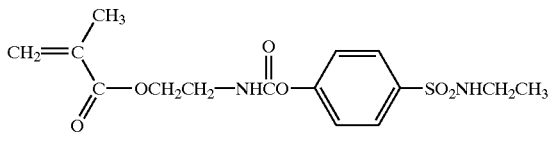

-continued (M9)
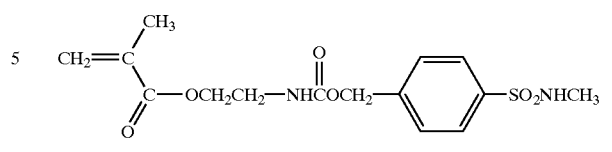

(M10)
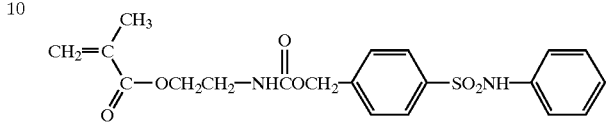

(M11)
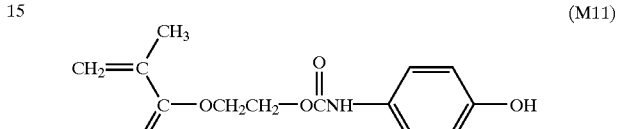

(M12)
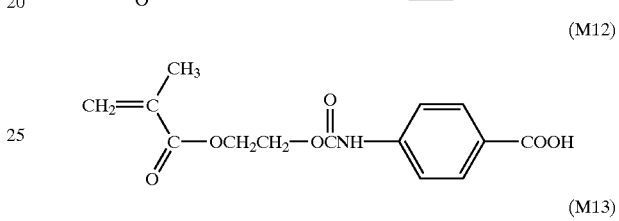

(M13)
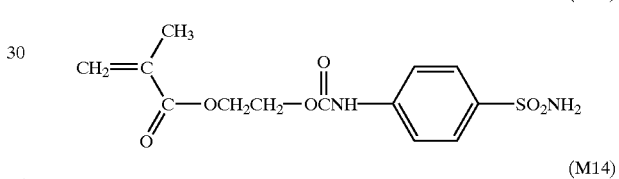

(M14)
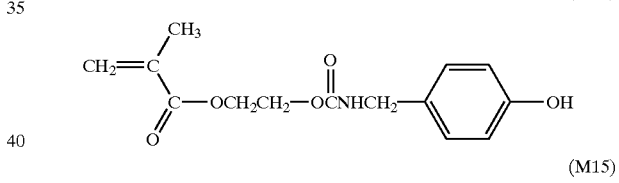

(M15)
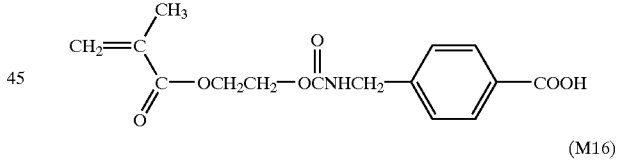

(M16)
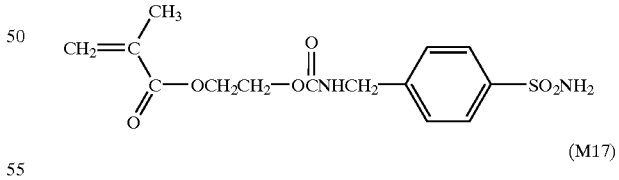

(M17)
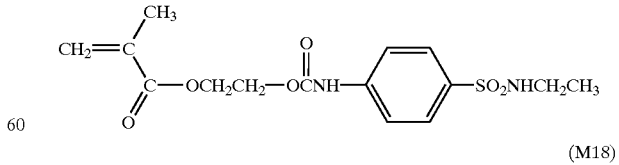

(M18)
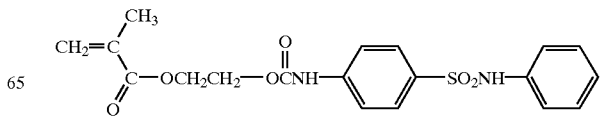

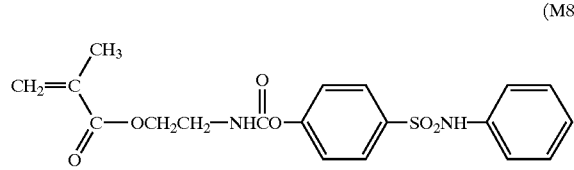

(M19) 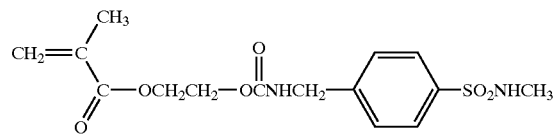
(M20) 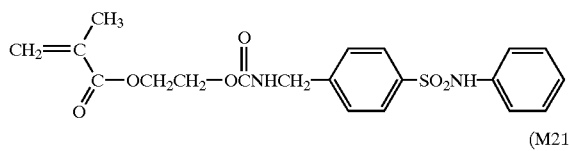
(M21) 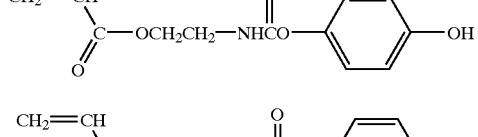
(M22) 
(M23) 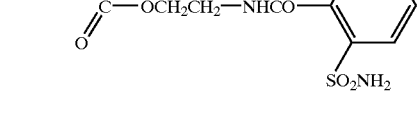
(M24) 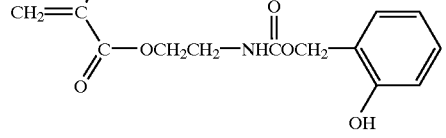
(M25) 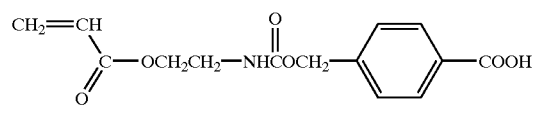
(M26) 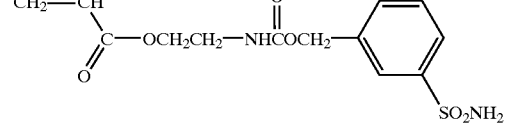
(M27) 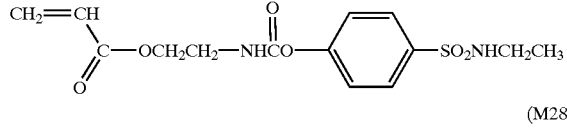
(M28) 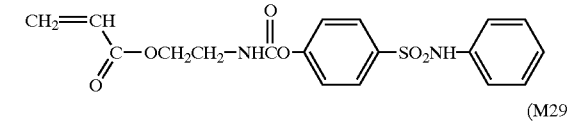
(M29) 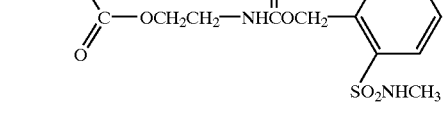
(M30) 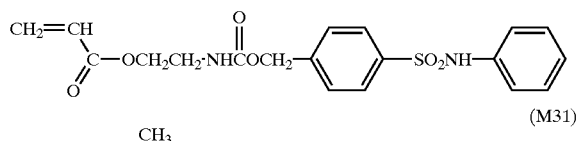
(M31) 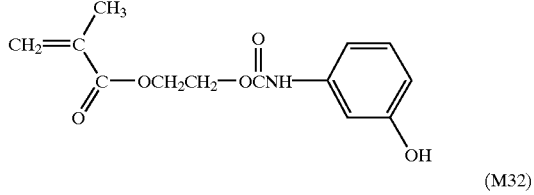
(M32) 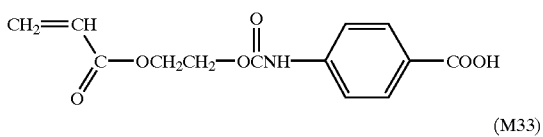
(M33) 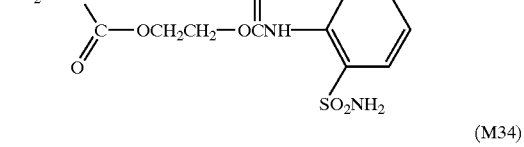
(M34) 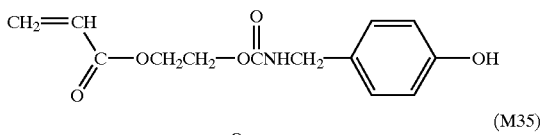
(M35) 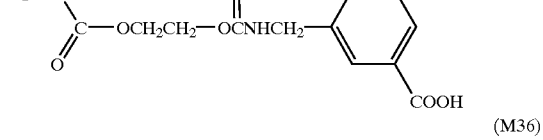
(M36) 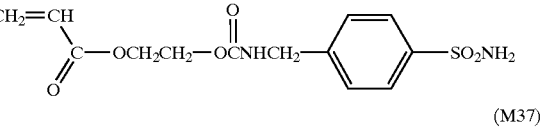
(M37) 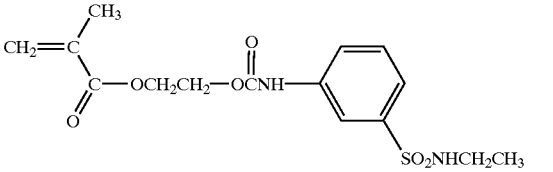
(M38) 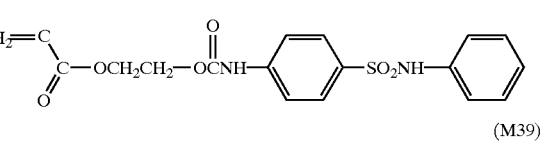
(M39) 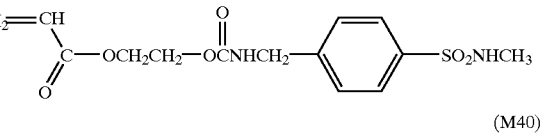

-continued

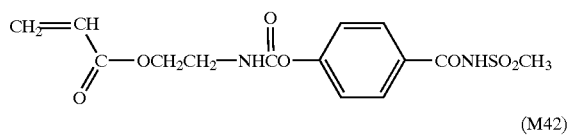
(M41)

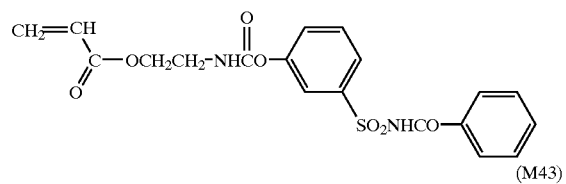
(M42)

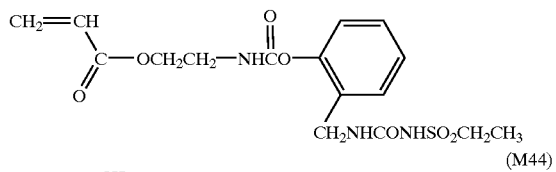
(M43)

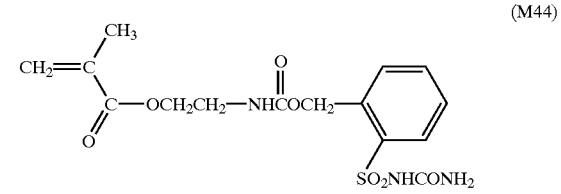
(M44)

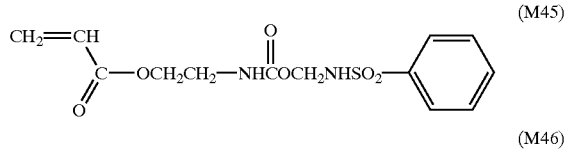
(M45)

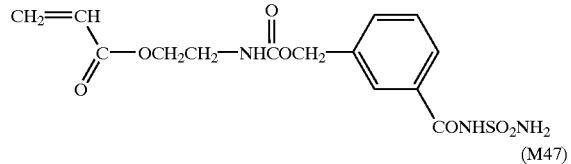
(M46)

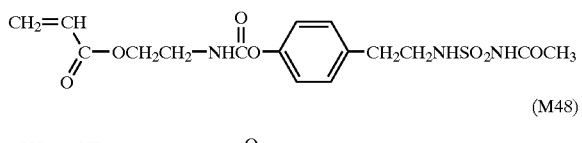
(M47)

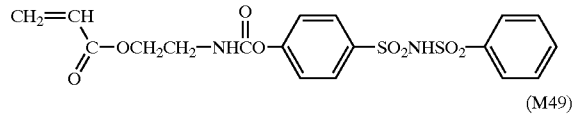
(M48)

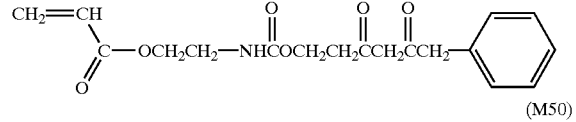
(M49)

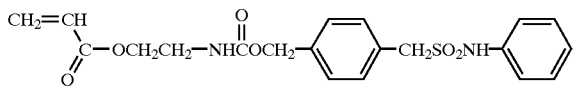
(M50)

The polymer usable in the present invention may be a single polymer or a copolymer obtained from monomer components comprising at least one low molecular compound (I) or (II) and preferably, a copolymer prepared from monomer components comprising at least one compound of (I) or (II) and at least one compound that comprises at least one polymerizable unsaturated bond and no sulfonamide group, urea bond or urethane bond.

Examples of such compound comprising polymerizable unsaturated bond and no sulfonamide group, urea bond or urethane bond include those selected from the group consisting of acrylic acid, methacrylic acid, acrylic acid esters, acrylamides, methacrylic acid esters, methacrylamides, allyl compounds, vinyl ethers, vinyl esters, styrenes, crotonic acid esters and the like. More specifically, such compound includes, for example, acrylic acid esters such as alkyl (preferably $C_1$~$C_{10}$ alkyl) acrylate (e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 2-hydroxyethyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, and the like), aryl acrylate (e.g., phenyl acrylate and the like): methacrylic acid esters such as alkyl (preferably $C_1$~$C_{10}$ alkyl) methacrylate (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfaryl methacrylate, tetrahydrofurfuryl methacrylate and the like), aryl methacrylate (e.g., phenyl methacrylate, cresyl methacrylate, naphthyl methacrylate and the like): acrylamides such as acrylamide, N-alkylacrylamide (wherein said alkyl includes $C_1$~$C_{10}$ alkyl, e.g., methyl, ethyl, propyl, butyl, t-butyl, heptyl, octyl, cyclohexyl, hydroxyethyl, and benzyl group and the like), N-arylacrylamide (wherein said aryl group includes, for example, phenyl, tolyl, nitrophenyl, naphthyl, hydroxyphenyl and the like.), N,N-dialkylacrylamide (wherein said alkyl group includes $C_1$~$C_{10}$ alkyl, e.g., methyl, ethyl, butyl, isobutyl, ethylhexyl, cyclohexyl and the like), N,N-arylacrylamide (wherein said aryl group includes, for example, phenyl group and the like), N-methyl-N-phenylacrylamide, N-hydroxyethyl-N-methylacrylamide, N-2-acetamideethyl-N-acetylacrylamide and the like: methacrylamides, e.g., methacrylamide, N-alkylmethacrylamide (wherein, said alkyl group includes $C_1$~$C_{10}$, e.g., methyl, ethyl, t-butyl, ethylhexyl, hydroxyethyl, cyclohexyl and the like), N-arylmethacrylamide (wherein said aryl group includes phenyl group and the like), N,N-dialkylmethacrylamide (wherein said alkyl group includes ethyl, propyl, butyl and the like), N,N-diarylmethacrylamide (wherein said aryl group include phenyl group and the like), N-hydroxyethyl-N-methylmethacrylamide, N-methyl-N-phenylmethacrylamide, N-ethyl-N-phenylmethacrylamide and the like: allyl compounds such as allyl esters (e.g., allyl acetate, allyl caproate, allyl caprylate, allyl laurylate, allyl palmitate, allyl stearate, allyl bezoate, allyl acetoacetate, allyl lactate and the like), allyloxyethanol and the like: vinyl ethers, such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether and the like), vinyl aryl ether (e.g., vinyl phenyl ether, vinyl tolyl ether, vinyl chlorophenyl ether, vinyl 2,4-dichlorophenyl ether, vinyl naphthyl ether, vinyl anthranyl ether and the like): vinyl esters such as vinyl butyrate, vinyl isobutyrate, vinyl trimethylacetate, vinyl iethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate), vinyl cyclohexylcarboxylate, vinyl benzoate, vinyl salicylate, vinyl chlorobenzoate, vinyl tetrachlorobenzoate, vinyl naphthoate and the like: styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene and the like), alkoxystyrene (e.g., methoxystyrene, 4-methoxy-3-methylstyrene, dimethoxystyrene and the like), halogenized-styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene and the like): crotonic acid esters such as alkyl crotonate (e.g., butyl crotonate, hexyl crotonate, glycerin monocrotonate and the like): dialkyl itaconates (e.g., dimethyl itaconate, diethyl itaconate, dibutyl itaconate and the like): dialkyl esters of maleic acid or fumaric acid (e.g., dimethyl maleate, dibutyl fumarate and the like): acrylonitrile, methacrylonitrile and the like.

Preferred examples of such compounds having polymerizable unsaturated bond include esters of methacrylic acid, esters of acrylic acid, methacrylamides, acrylamides, acrylonitrile, methacrylonitrile, methacrylic acid and acrylic acid.

The copolymer of at least one of these compound having polymerizable unsaturated bond and at least one of low molecuar compound represented by general formula (I) or (II) can be block copolymer, random copolymer or graft copolymer.

In the copolymer, the structure unit comprising sulfonamide group, urea bond or urethane bond is preferably 5 mole % or more and more preferably from 10 to 90 mole % based on the whole structure unit of the copolymer.

Examples of solvent usable in the preparation of such polymers include ethylene dichloride, cyclohexanone, methyl ethyl ketone, acetone, methanol, ethanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, ethyl lactate and the like.

These solvents may be used alone or in combination.

Preferable molecular weight of the polymer of the present invention is 2,000 or higher by weight-avarage molecular weight and 1,000 or higher by number-average molecular weight. More preferably, it ranges from 5,000 to 300,000 by weight-average molecular weight and 2,000 to 250,000 by number-average molecular weight. Polydispersity (weight-average molecular weight/number-average molecular weight) of the polymer is preferably 1 or higher and more preferably from 1.1 to 10.

Also, the polymer of the present invention may comprise unreacted monomer. In such case, the amount of monomer in the polymer is desirebly 15% by weight or less.

The polymer of the present invention may be utilized alone or in combination. The amount of the polymer comprised in the photosensitive composition is about 5% to 95% by weight and preferably about 10% to 85% by weight.

The photosensitive layer of the present invention may furhter comprise, in addition to the aforementioned polymers, known polymers that are alkaline-soluble polymers such as cresol-formaldehyde resin, phenol/modified xylene resin, polyhydroxystyrene, polyhalogenized hydroxystyrene, e.g., phenol-formaldehyde resin, m-cresol-formaldehyde resin, p-cresol-formaldehyde resin, m-/p-mixed cresol-formaldehyde resin, phenol-cresol (m-, p-, or m-/p-mixture) mixed formaldehyde resin. The weight-average molecular weight of preferable these alkaline-soluble polymers ranges 500~20,000, and the number-average molecular weight ranges 200~60,000. Usually, such alkaline-soluble polymers can be used in amount of 70% by weight or less based on the total amount of the photosensitive composition.

In addition, it is preferable to use a condensate of phenol having $C_3$–$C_8$ alkyl group as a substituent and formaldehyde such as t-butylphenol-formaldehyde resin or octylphenol-formaldehyde resin as described in U.S. Pat. No. 4,123,279, with said polymers to improve the sensitivity to grease of the image area.

It is preferable to add cyclic acid anhydrides, phenols and organic acids into photosensitive layer of the present invention to increase the sensitivity of the layer. Examples of cyclic acid anhydrides include compounds as described in U.S. Pat. No. 4,115,128 such as phthalic anhydride, tetrahydrophthalic anhydride, hexahydrophthalic anhydride, 3,6-endooxy-$\Delta^4$-tetrahydrophthalic anhydride, tetrachlorophthalic anhydride, maleic anhydride, chloromaleic anhydride, α-phenylmaleic anhydride, succinic anhydride, and pyromellitic anhydride. Examples of phenols include bisphenol A, p-nitrophenol, p-ethoxyphenol, 2,3,4-trihydroxybenzophenone, 4-hydroxybenzophenone, 2,4,4"-trihydroxybenzophenone, 4,4,4"-trihydroxy-triphenylmethane, 4,4',3",4"-tetrahydroxy-3,5,3',5'-tetramethyltriphenylmethane and the like.

Examples of organic acids include sulfonic acids, sulfinic acids, alkyl sulfates, phosphonic acids, phosphinic acids, phosphate esters, carboxylic acids and the like as described in J.P. KOKAI No. Sho 60-88942 and J.P. KOKAI No. Hei 2-96755. More specificatlly, such compound includes p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephtalic acid, 1,4-cyclohexene-2,2-dicarboxylic acid, erucic acid, lauric acid, n-undecanoic acid, ascorbic acid and the like. The content of the foregoing cyclic acid anhydrides, phenols and/or organic acids in the photosensitive composition preferably ranges from 0.05% to 15% by weight and more preferably 0.1% to 5% by weight.

The composition used in the invention may further comprise, for extending the development latitude, non-ionic surfactants as disclosed in J.P. KOKAI Nos. Sho 62-251740 and Hei 2-181248 and/or amphoteric surfactants as disclosed in J.P. KOKAI No. Sho 59-121044 and Hei 2-115992. Specific examples of non-ionic surfactants are sorbitan tristearate, sorbitan monopalmitate, sorbitan trioleate, srearyl monoglyceride, polyoxyethylene sorbitan monooleate and polyoxyethylene nonyl phenyl ether and examples of amphoteric surfactants are alkyl di(aminoethyl)glycine, alkyl polyaminoethyl glycine hydrochloride, Amorgen K (trade name of an N-tetradecyl-N,N-betaine type surfactant, available from Dai-Ichi Kogyo Seiyaku Co., Ltd.), 2-alkyl- N-carboxyethyl-N-hydroxyethyl imidazolinium betaine and and Rebon 15 (trade name of an alkyl imidazoline type one available from Sanyo Chemical Industries, Ltd.). The content of the foregoing non-ionic surfactantas and/or amphoteric surfactatnts in the photosensitive composition preferably ranges from 0.05% to 15% by weight and more preferably 0.1% to 5% by weight.

The positive-working photosensitive composition used in the invention may comprise a printing out agent for obtaining a visible image immediately after exposure to light, a dye or pigment for coloring images or other fillers. Examples of dyes usable in the present invention include basic dyes comprised of a salt of cation containing basic dye skeleton and organic anion comprising sulfonic acid group as a sole exchane group and 10 or more of carbon atoms with 1 to 3 hydroxy groups as described in J.P. KOKAI No. Hei 5-313359.

The content of such compound in the photosensitive composition may be 0.2% to 5% by weight. Also, it may be possible to add a compound that is photodegradable to produce a degradation product that interacts with the dyes as disclosed in J.P. KOKAI No. Sho 50-36209 (=U.S. Pat. No. 3,969,118) to change a color. Such compound may include o-naphthoquinonediazide-4-sulfonyl halogenide disclosed in J.P. KOKAI No. Sho 50-36209 (U.S. Pat. No. 3,969,118), trihalomethyl-2-pyrone and trihalomethyltriazine disclosed in J.P. KOKAI No. Sho 53-36223 (U.S. Pat. No. 4,160,671), various o-naphthoquinonediazide compound described in J.P. KOKAI No. Sho 55-62444 (U.S. Pat. No. 2,038,801), and 2-trihalomethyl-5-aryl-1,3,4-oxadiazole compound described in J.P. KOKAI No. Sho 55-77742 (U.S. Pat. No. 4,279,982). These compounds can be added alone or incombination.

Other dyes as the agents for coloring images described in J.P. KOKAI No. Hei 5-313359 may also be used in place of the foregoing dyes. Preferred dyes inclusive of the salt-forming organic dyes are, for instance, oil-soluble and basic dyes.

Specific examples thereof are Oil Green BG, Oil Blue BOS and #603, (they are all available from Orient Chemical Industries, Co., Ltd.), Victoria Pure Blue BOH (Hodogaya Chemical Co. Ltd.), Rhodamine B (C145170B), Malachite Green (C142000) and Methylene Blue (C152015) and the like.

When a lithographic printing plate is prepared using the positive-working photosensitive composition of the present invention, a substrate for the printing plate may be, for example, aluminum plate which is previously subjected to hydrophilization (e.g., aluminum plate treated with silicate, anodized aluminum plate, grained aluminum plate, and aluminum plate electrodeposited with silicate), zinc plate, stainless plate, chromized steel plate, paper or plastic films, that are previously subjected to hydrophilization treatment.

Among these substrates, particularly preferred are aluminum plates. Aluminum plates include fine aluminum plate and aluminum alloy plate. Such aluminum alloy includes those comprised of aluminum and metals such as silicon, copper, manganese, magnesium, chrome, zinc, lead, bismuth, nickel and the like. These compositions may comprise negligible quantity of impurities in addition to a small amount of iron and titanium.

The aluminum plate may be optionally subjected to a surface treatment. For example, the plate is preferably subjected to a surface treatment such as graining, dipping into an aqueous solution of sodium silicate, potassium fluorozirconate or a phosphoric acid salt and anodizing. Further preferable aluminum plates include, for instance, those which are grained and then immersed in an aqueous solution of sodium silicate as disclosed in U.S. Pat. No. 2,714,066; and those anodized and then dipped in an aqueous solution of an alkali metal silicate as disclosed in U.S. Pat. No. 3,181,461. The above-described anodization can be conducted by passing a current through the aluminum plate as a cathode in an electrolyte, which is a single or combined aqueous or non-aqueous solution comprising inorganic acid (e.g., phosphoric acid, chromic acid, sulfamic acid, sulfuric acid, boric acid and the like), organic acid (e.g., oxalic acid, sulfamic acid and the like) or salts thereof.

It is also efective to subject the aluminum substrate to silicate electrodeposition as disclosed in U.S. Pat. No. 3,658,662.

These hydrophilization treatments are performed not only for making the surface of the substrate hydrophilic but also for preventing the occurrence of any detrimental reaction with the photosensitive composition applied thereon and for enhancing the adhesion thereof to the photosensitive layer.

The aluminum plate may be optionally subjected to removal of rolling oil and/or to pretreatment to expose a clean surface before graining the surface. For said removal of rolloing oil, solvent such as trichloroethylene and/or surfactants can be used. For said pretreatment, generally an alkaline etchant such as sodium hydroxide, potassium hydroxide and the like can be used.

The aluminum plate can be surface-grained by, for instance, mechanical, chemical or electrochemical surface graining treatment. The mechanical surface-graining treatment can be carried out by any known methods such as ball graining, blast graining, and brush graining with nyron brush using slurry of pumice stones as an abrasive in water. Suitable chemical surface graining is, for example, to dip the plate into a saturated aqueous solution of aluminum salt of mineral acid as described in J.P. KOKAI No. Sho 54-31187. Preferred electrochemical surface graining is, for instance, to conduct electrolysis by passing an alternating current through the aluminum plate in an acidic electrolyte such as hydrochloric acid, nitric acid and mixture thereof. Among these graining methods, it is preferable to use a combination of mechanical graining and electrochemical graining since adhesion of image to such treated substrate is strong.

It is preferred to conduct the above-mentioned graining so that the roughness of the surface at centerline of aluminum plate (Ha) becomes in a range of $0.3\sim1.0\mu$.

Thus grained aluminum plate may be optionally subjected to washing with water and chemical etching.

Solution for the etching treatment is generally selected from basic or acidic aqueous solutions which are capable of dissolving aluminum. The solution should be selected from the solutions that do not form a layer derived from components of the solution on the surface subjected to etching. Examples of preferred etching agents include basic materials such as sodium hydroxide, potassium hydroxide, tribasic sodium phosphate, dibasic sodium phosphate, tribasic potassium phosphate, dibasic potassium phosphate and the like; and acidic materials such as sulfuric acid, persulfuric acid, phosphoric acid, hydrochloric acid and salt thereof. Metals having lower ionization tendency than that of aluminum such as zinc, chromium, cobalt, nickel, and copper are not preferable because undesired layer will be formed on the surface.

It is preferable to conduct the etching under conditions (such as concentration, temperature and the like) such that the rate of dissolution of aluminum or alloy thereof ranges 0.3 to 40 $g/m^2$ per one minute of dipping. But it is also possible to use other condition that exceeds or underperfoms this range.

The etching may be conducted by immersing the aluminum plate in the aforementioned etching solution or by applying the etching solution on the aluminum plate. Preferably, the etching is conducted so that the amount of etching becomes in the rage of 0.5~10 g/m$^2$.

As the etching agent, it is preferable to use basic solutions since etching rate is fast. In this case, generally the plate is subjected to desmutting treatment since smut is formed on the surface of the plate. Examples of acid used for desmutting treatment include nitric acid, sulfuric acid, phosphoric acid, chromic acid, hydrofluoric acid, fluoboric acid and the like.

The aluminum plate subjected to etching treatment may be optionally washed with water and anodized. Anodization can be conducted by any method conventionally utilized in this field. More specifically, anodized layer can be formed on the surface of aluminum substrate by passing direct or alternating current through the aluminum plate in an aqueous solution comprising one or more of sulfuric acid, phosphoric acid, chromic acid, oxalic acid, sulfamic acid, and benzenesulfonic acid or non-aqueous solution.

Although the condition for anodization varies depending on the electrolyte used, generally the following conditions are suitably used; concentration of electrolyte is from 1% to 80% by weight, temperature of the solution is from 5 to 70° C., current density is from 0.5 to 60 A/dm$^2$, electrical voltage is 1 to 100V, time for anodization is 30 seconds to 50 minutes.

Among the anodization methods, particularly the method to anodize in sulfuric acid using high current density described in British Patent No.1,412,768, and the method to anodize using phosphoric acid as an electrolyte described in U.S. Pat. No. 3,511,661 are preferred.

Thus grained and anodized aluminum plate may be further optionally hydrophilized. Examples of preferred hydrophilization treatment are; to treat the aluminum plate in a solution of alkali metal silicate such as sodium silicate solution as described in U.S. Pat. Nos. 2,714,066 and 3,181,461, to treat the plate with potassium fluorozirconate as described in J.P. KOKOKU No.Sho 36-22063, and to treat the plate with polyvinylphosphonic acid as described in U.S. Pat. No. 4,153,461.

Further, an underlying layer comprising water-soluble compound may be also applied, if desired, onto the aluminum plate that has been grained, anodized and optionally hydrophilized. Water-soluble compounds used in the underlying layer are, for instance, combination of water-soluble metal salt and hydrophilic cellulose (e.g., zinc chloride and carboxymethylcellulose, magnesium chloride and hydroxylethylcellulose and the like) as described in J.P. KOKOKU No. Sho 57-16349, polyacrylamide as described in U.S. Pat. No. 3,511,661, polyvinylphosphonic acid as described in J.P. KOKOKU No. Sho 46-35685, amino acid and salts thereof (alkali metal salts such as Na salt, K salt and the like, ammonium salt, hydrochloride, oxalate, acetate, phosphate and the like) as described in J.P. KOKAI No. Sho 60-149491, amines comprising hydroxy group and salts thereof as described in J.P. KOKAI No. Sho 60-232998 and amines comprising hydroxy group and salts thereof is particularly preferred. Preferably, the solid content of the underlying layer comprising water-soluble compound is 1 mg/m$^2$~80 mg/m$^2$.

The presensitized plate of the present invention can be prepared by dissolving the above-mentioned components of photosensitive composition in a solvent and applying the solution onto the substrate. Examples of solvent usable in the present invention include γ-butyrolactone, ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, toluene, ethyl acetate, methyl lactate, ethyl lactate, dimethylsulfoxide, dimethylacetamide, dimethylformamide, water, N-methylpyrrolidone, tetrahydrofurfurylalcohol, acetone, diacetone alcohol, methanol, ethanol, isopropanol, diethylene glycol dimethyl ether and the like. These solvents can be used alone or incombination. The content of the solid component in the coating solution is suitably from 2% to 50% by weight. The amount of solid components to be applied on the substrate varies depending on the purpose but preferably from 0.5~3.0 g/m$^2$ as solid content. The sensitivity of the presensitized plate would increase in accordacne with the decrease of the amount of solid components to be applied, but is associated with deterioration of physical property of the photosensitive layer.

The photosensitive layer of the presensitized plate of the present invention may comprise a surfactant such as a fluorine atom-containing surfactant as disclosed in J.P. KOKAI No. Sho 62-170950 (=U.S. Pat. No. 4,822,713) for improving the coating properties thereof. The amount thereof to be added preferably ranges from 0.001% to 1.0% by weight and more preferably 0.005% to 0.5% by weight on the basis of the total weight of the composition.

A mat layer is preferably formed on the surface of the photosensitive layer thus formed to reduce the time required for evacuation during contact exposure using a vacuum printing frame and to prevent the formation of an indistinct image during printing. Such mat layer can be formed by the method as disclosed in J.P. KOKAI No. Sho 50-125805, J.P. KOKOKU Nos. Sho 57-6582 and Sho 61-28986, or by the method of heat-welding of solid powder onto the surface of the photosensitive layer as disclosed in J.P. KOKOKU No. Sho 62-62337.

Preferable developer for the presensitized plate of the present invention is an alkali aqueous solution that does not substantially comprise organic solvent. Examples of such alkali aqueous solution include aqueous solution of sodium silicate, potassium silicate, sodium hydroxide, potassium hydroxide, lithium hydroxide, tribasic sodium phosphate, dibasic sodium phosphate, tribasic ammonium phosphate, dibasic ammonium phosphate, sodiuom metasilicate, sodium carbonate, p sodium bicarbonate, otassium carbonate, potassium bicarbonate, ammonia water and the like. These alkaline agents may be added so that the concentration thereof is in the ragne of 0.1% to 10% by weight, preferably in the range of 0.5% to 5% by weight.

Among these developers, preferred are those comprising alkali silicates such as potassium silicate, lithium silicate, sodium silicate and the like since contamination in printing can be reduced by such developers. Preferably a developer comprising sodium silicate having a molar ratio: [SiO$_2$]/[M] ranging from 0.5 to 2.5 and SiO$_2$ content ranging from 0.8% to 8% by weight.

The developer may comprise, for example, water-soluble sulfites such as sodium sulfite, potassium sulfite and magnesium sulfite, resorcin, methylresorcin, hydroquinone, thiosalicylic acid and the like. The amount of these compounds in the developer ranges preferably from 0.002% to 4% by weight and more preferably from 0.01% to 1% by weight.

Also, the developer usable in the present invention may further comprise at least one of anionic surfactant and amphoteric surfactant as described in J.P. KOKAI Nos. Sho 50-51324 and Sho 59-84241, or nonionic surfactant as described in J.P. KOKAI Nos. Sho 59-75255, Sho 60-111246 and Sho 60-213943. Alternatively, the developer may comprise polymer electrolyte as described in J.P. KOKAI Nos. Sho 55-95946 and Sho 56-142528. These additives are preferable since they can improve wetting poperty of the developer to the photosensitive composition or improve the stability (latitude) in development. The amount of such surfactants added to the developer is preferably from 0.001% to 2% by weight, and more preferably from 0.003% to 0.5% by weight. In addition, it is preferable to contain 20 mole % or more of potassium based on the total alkali metals as an alakali metal of said silicate because of less formation of insoluble materials. More preferably, the amount of potassium is 90 mole % or more and most preferably 100 mole %.

The developer usable for the present invention may further comprise anti-foaming agent such as organic solvent (e.g., some alcohols), chelating agent as described in J.P. KOKAI No. Sho 58-190952, metalic salt as described in J.P. KOKOKU No. Hei 1-30139, organic silane compounds and the like.

Examples of light source suitable for exposure in the present invention include carbon arc light, mercury vapor lamp, xenon lamp, tungsten lamp, metal halide lamp, and the like.

The presensitized plate can be processed as described in J.P. KOKAI Nos. Sho 54-8002, Sho 55-115045 and Sho 59-58431. That is, the plate may be subjected to washing-treatment with water and desensitizing treatment after development, or directly subjected to desensitizing treatment, treatment with acid-containing water, or desensitizing treatment after the treatment with acid-containing water. In the development process of the presensitized plate, developability of the developer sometimes becomes lowered because of decrease of the alkaline concentration as a result of consumption of aqueous alkaline solution used for the development or contamination of air after running automatic developing machine for long time. In such case, the developability of the developer can be recovered by adding replenisher or by replenishing method as described in J.P. KOKAI No. Sho 54-62004. In addition, it is preferable to conduct the above process using an automatic developing machine as described in J.P. KOKAI Nos. Hei 2-7054 and Hei 2-32357.

Further, after processing the plate (i.e., image-wise exposing, developing, washing with water and rincing the plate), if it is necessary to remove undesired image, a solution for elimination as described in J.P.KOKOKU No. Hei 2-13293 can be preferably used. In addition, example of desensitizing gum optionally used in the last step in making the lithographic plate includes those as described in J.P. KOKOKU Nos. Sho 62-16834, Sho 62-25118, and Sho 63-52600, and J.P. KOKAI Nos. Sho 62-7595, Sho 62-11693, and Sho 62-83194. In addition, when the burning treatment is conducted after the optional process to remove the image area as described above, it is preferable to treat the plate with a composition prior to the burning treatment as described in J.P. KOKOKU Nos. Sho 61-2518 and Sho 55-28062, and J.P. KOKAI Nos. Sho 62-31859 and Sho 61-159655.

EXAMPLES

The present invention will hereinafter be explained in more detail with reference to the following non-limitative working Examples. In Examples, "%" without any indication means "% by weight".

Preparation Example 1

In a 200 ml volume of three-neck round bottom flask equipped with a condenser, an agitator and a dropping funnel, N-(p-aminosulfonylphenyl)methacrylamide (3.60 g, 0.015 mole), 2-hydroxyethyl methacrylate (1.30 g, 0.01 mole), methyl methacrylate (1.50 g, 0.015 mole), acrylonitrile (3.18 g, 0.06 mole) and N,N-dimethylacetamide (20 g) were added and the mixture was stirred in a water bath at 65° C. To the mixture, V-65 (Wako Pure Chemicals Co. Ltd.) (0.25 g) was added and the mixture was stirred for 2 hours at 65° C. under nitrogen atomosphere. A mixture of N-(p-aminosulfonylphenyl)methacrylamide (3.60 g), 2-hydroxyethyl methacrylate (1.30 g), methyl methacrylate (1.50 g), acrylonitrile (3.18 g) and N,N-dimethylacetamide (20 g) and V-65 (0.25 g) was added dropwise to the mixture over 2 hours through a dripping funnel. After completion of the addition of the mixture, the reaction mixture was further stirred for 2 hours at 65° C. After then, 40 g of methanol was added and the mixture was cooled. Two litter of water was added to the mixture under stirring. The stirring was continued for another 30 minutes and then, it was filtered and dried to obtain 18 g of white solid. Weight-average molecular weight of the polymer determined by gel permeation chromatography (polystyrene standard) was 45,000 (polymer (a)).

Preparation examples 2~9

Polymers (b) to (i) (shown in Table 1) were prepared as described in Preparation example 1.

TABLE 1

| polymer | repeating unit of polymer | molar ratio | molecular weight |
|---|---|---|---|
| (a) | —(CH$_2$—C(CH$_3$))— \| CONH—C$_6$H$_4$—SO$_2$NH$_2$ <br><br> —(CH$_2$—C(CH$_3$))— \| COOCH$_2$CH$_2$OH | 15:10:60:15 | 45000 |

TABLE 1-continued

| polymer | repeating unit of polymer | molar ratio | molecular weight |
|---|---|---|---|
| | —(CH$_2$—CH)— <br>            CN <br><br> —(CH$_2$—C(CH$_3$))— <br>            COOCH$_3$ | | |
| (b) | —(CH$_2$—C(CH$_3$))—CONH—C$_6$H$_4$—SO$_2$NH$_2$ <br><br> —(CH$_2$—CH)—CN <br><br> —(CH$_2$—C(CH$_3$))—COOCH$_3$ | 35:30:35 | 36000 |
| (c) | —(CH$_2$—C(CH$_3$))—COOCH$_2$CH$_2$NHCOOCH$_2$—C$_6$H$_4$—OH <br><br> —(CH$_2$—CH)—CN <br><br> —(CH$_2$—C(CH$_3$))—COOCH$_3$ | 15:60:25 | 58000 |
| (d) | —(CH$_2$—C(CH$_3$))—COOCH$_2$CH$_2$NHCOO—C$_6$H$_4$—SO$_2$NH$_2$ <br><br> —(CH$_2$—CH)—CN <br><br> —(CH$_2$—C(CH$_3$))—COOCH$_3$ | 20:60:20 | 48000 |
| (e) | —(CH$_2$—C(CH$_3$))—COOCH$_2$CH$_2$NHC(O)NH—C$_6$H$_4$—SO$_2$NH$_2$ <br><br> —(CH$_2$—CH)—CN | 25:15:60 | 26000 |

TABLE 1-continued

| polymer | repeating unit of polymer | molar ratio | molecular weight |
|---|---|---|---|
| | —(CH$_2$—C(CH$_3$)(COOCH$_3$))— | | |
| (f) | —(CH$_2$—C(CH$_3$)(COOCH$_2$CH$_2$NHCONH-C$_6$H$_4$-OH))—<br>—(CH$_2$—CH(CN))—<br>—(CH$_2$—C(CH$_3$)(COOCH$_3$))— | 25:60:15 | 46000 |
| (g) | —(CH$_2$—C(CH$_3$)(COOCH$_2$CH$_2$NHCONH-C$_6$H$_4$-OH))—<br>—(CH$_2$—C(CH$_3$)(COOCH$_2$CH$_2$OH))—<br>—(CH$_2$—C(CH$_3$)(COOCH$_3$))— | 20:30:40 | 34000 |
| (h) | —(CH$_2$—C(CH$_3$)(CONH-C$_6$H$_4$-SO$_2$NH$_2$))—<br>—(CH$_2$—C(CH$_3$)(CONH-C$_6$H$_4$-OH))—<br>—(CH$_2$—CH(CN))— | 30:30:40 | 67000 |
| (i) | —(CH$_2$—C(CH$_3$)(COOH))—<br>—(CH$_2$—CH(CN))— | 20:40:30 | 56000 |

TABLE 1-continued

| polymer | repeating unit of polymer | molar ratio | molecular weight |
|---------|---------------------------|-------------|------------------|
|         | —(CH₂—C(CH₃)(COOCH₃))—    |             |                  |

Examples 1~20 and Comparative examples 1~4

Surface of an aluminum plate having thickness of 0.30 mm was grained with nyron brush with a suspension of 400 mesh pumice stone in water and then fully washed with water. The plate was immersed in aqueous solution of 10% sodium hydroxide at 70° C. for 60 seconds to etch the plate and washed with water. Then the plate was washed with 26% $HNO_3$ to neutralize and again washed with water. Next, electrolytic graining of the plate was conducted in 1% aqueous solution of nitric acid using rectangle alternating continuous wave voltage with $V_A=12.7$ volts and in a quantity of electricity at the anode of 160 coulomb/dm².

Roughness of the surface (Ra) was 0.6 μm. The plate was then immersed in 30% aqueous $H_2SO_4$ soultion at 55° C. for 2 minutes to conduct desmutting treatment. Further, the plate was anodized in 20% aqueous $H_2SO_4$ solution using 2 A/dm2 of current density to obtain a substrate having 2.7 g/m² of anodized layer.

The surface of thus obtained plate was then coated with Coating solution (A) for underlying layer and dried for 30 seconds at 80° C. The amount of the layer after dried was 30 mg/m².

| Coating solution (A) for undelying layer | |
|---|---|
| Aminoethylphosphonic acid | 0.01 g |
| Phenylphosphonic acid | 0.15 g |
| Triethanolamine | 0.05 g |
| β-Alanine | 0.10 g |
| Methanol | 40 g |
| Pure water | 60 g |

Thus, substrate (I) was obtained.

Then Coating solution (B), (C) or (D) for photosensitive layer was applied on substrate (I) using rod coating in the amount of 25 ml/m², and then dried at 100° C. for 1 minute to obtain positive-working presensitized plate [B]-1~[B]-13, [C]-1~[C]-10 and [D]-1 (Table 2). The amount of each coating on the substrate after dried was 1.7 g/m².

In Table 2, polymers (a)~(i) used in Coating solutions [B] and [C] are shown in Table 1.

| [Coating solution (B) for photosensitive layer] | |
|---|---|
| Ester compound of 1,2-naphthoquinone-2-diazidesulfonic acid (Table 2) | 0.45 g |
| Cresol-formaldehyde novolak resin (meta/para = 6/4, weight-average molecular weight: 3,000, number-average molecular weight: 1,100, containing 0.7% of unreacted cresol) | 0.2 g |
| m-Cresol-formaldehyde novolak resin (weight-average molecular weight 1,700, number-average molecular weight 600, containing 1% of unreacted cresol) | 0.3 g |
| Condesate of pyrogallol and acetone (weight-average molecular weight 2,200, number-average molecular weight 700) | 0.1 g |
| Polymer of the present invention | 1.1 g |
| p-Normaloctylphenol-formaldehyde resin (as described in U.S. Pat. No. 4,123,279) | 0.02 g |
| Naphthoquinonediazide-1,2-diazide-4-sulfonyl chloride | 0.01 g |
| Tetrahydrophthalic anhydride | 0.01 g |
| Benzoic acid | 0.02 g |
| 4-[p-N-(p-Hydroxybenzoyl)aminophenyl]-2,6-bis(trichloromethyl)-s-triazine | 0.02 g |
| N-(1,2-Naphthoquinone-2-diazide-4-sulfonyloxy)-cyclohexane-1,2-dicarboximide | 0.01 g |
| Dye derived from Victoria Pure Blue BOH [Hodogaya Chemical Co., Ltd.] by chainging counter anion thereof to 1-naphthalene sulfonic acid | 0.05 g |
| Curcumin | 0.005 g |
| 1-(α-Methyl-α-(4-hydroxy-3,5-dihydroxymethylphenyl)ethyl)-4-[α,α-bis(4-hydroxy-3,5-dihydroxymethylphenyl)ethyl]benzene (Compound (X) in J.P. KOKAI No. Hei 6-282067) | 0.04 g |
| Megafac F-176 (Dainippon Ink and Chemicals, Inc., fluorine atom-containing surfactant) | 0.01 g |
| Methyl ethyl ketone | 10 g |
| γ-Butyrolactone | 5 g |
| 1-Methoxy-2-propanol | 5 g |

-continued

[Coating solution (C) for photosensitive layer]

| | |
|---|---|
| Ester compound of 1,2-naphthoquinone-2-diazidesulfonic acid (Table 2) | 0.45 g |
| Polymer of the present invention (or Comparative polymer) | 1.7 g |
| Naphthoquinonediazide-1,2-diazide-4-sulfonyl chloride | 0.01 g |
| Tetrahydrophthalic anhydride | 0.02 g |
| Benzoic acid | 0.02 g |
| 4-[p-N-(p-Hydroxybenzoyl)aminophenyl]-2,6-bis(trichloromethyl)-s-triazine | 0.02 g |
| N-(1,2-Naphthoquinone-2-diazide-4-sulfonyloxy)cyclohexane-1,2-dicarboximide | 0.01 g |
| Dye derived from Victoria Pure Blue BOH [Hodogaya Chemical Co., Ltd.] by chainging counter anion thereof to 1-naphthalene sulfonic acid | 0.05 g |
| Curcumin | 0.005 g |
| 1-[α-Methyl-α-(4-hydroxy-3,5-dihydroxymethylphenyl)ethyl]-4-(α,α-bis(4-hydroxy-3,5-dihydroxymethylphenyl)ethyl]benzene (Compound (X) in J.P. KOKAI No. Hei 6-282067) | 0.04 g |
| Megafac F-176 (Dainippon Ink and Chemicals, Inc., fluorine atom-containing surfactant) | 0.01 g |
| Methyl ethyl ketone | 10 g |
| γ-Butyrolactone | 5 g |
| 1-Methoxy-2-propanol | 5 g |

[Coating solution (D) for photosensitive layer]

| | |
|---|---|
| Ester compound of 1,2-naphthoquinone-2-diazidesulfonic acid (Table 2) | 0.45 g |
| Cresol-formaldehyde novolk resin (ratio of meta/para = 6/4, weight-average molecular weight 3,000, number-average molecular weight 1,100, containing 0.7% of unreacted cresol) | 1.3 g |
| m-Cresol-formaldehyde novolak resin (weight-average molecular weight 1,700, number-average molecular weight 600, containing 1% of unreacted cresol) | 0.3 g |
| Condensate of pyrogallol and acetone (weight-average molecular weight 2,200, number-average molecular weight 700) | 0.1 g |
| p-Normaloctylphenol-formaldehyde resin (as described in U.S. Pat. No. 4,123,279) | 0.02 g |
| Naphthoquinonediazide-1,2-diazide-4-sulfonyl chloride | 0.01 g |
| Tetrahydrophthalic anhydride | 0.01 g |
| Benzoic acid | 0.02 g |
| 4-[p-N-Hydroxybenzoyl) aminophenyl]-2,6-bis (trichloromethyl)-s-triazine | 0.02 g |
| N-(1,2-Naphthoquinone-2-diazide-4-sulfonyloxy)-cyclohexane-1,2-dicarboximide | 0.01 g |
| Dye derived from Victoria Pure Blue BOH [Hodogaya Chemical Co., Ltd.] by chainging counteranion thereof to 1-naphthalenesulfonic acid | 0.05 g |
| Curcumin | 0.005 g |
| 1-(α-Methyl-α-(4-hydroxy-3,5-dihydroxymethylPhenyl)ethyl]-4-[α,α-bis(4-hydroxy-3,5-dihydroxymethylphenyl)ethyl]benzene (Compound (X) in J.P. KOKAI No. Hei 6-282067) | 0.04 g |
| Megafac F-176 (Dainippon Ink and Chemicals, Inc., fluorine atom-containing surfactant) | 0.01 g |
| Methyl ethyl ketone | 10 g |
| γ-Butyrolactone | 5 g |
| 1-Methoxy-2-propanol | 5 g |

TABLE 2

| Sample No. | Photosensitive composition | (a) Ester of 1,2-naphthoquinone-2-diazide-5-sulfonic acid (hereinafter, 1,2-naphthoquinone-2-diazide-5-sulfonyl chloride is called as compound A) | (b) Ester of 1,2-naphthoquinone-2-diazide-4-sulfonic acid (hereinafter, 1,2-naphthoquinone-2-diazide-4-sulfonyl chloride is called as compound B) | (a)/(b) weight ratio | Polymer |
|---|---|---|---|---|---|
| B-1 | B | Ester of 2,3,4-trihydroxybenzophenone and compound A (esterification ratio; 90 mol %) | Ester of 2,3,4-trihydroxybenzophenone and compound B (esterification ratio; 90 mol %) | 5/5 | (a) |
| B-2 | B | Ester of 2,3,4-trihydroxybenzophenone and compound A (esterification ratio; 90 mol %) | Ester of N-hydroxy-1,2-cyclohexanedicarboximide and compound B | 5/5 | (a) |
| B-3 | B | Ester of pyrogallol-acetone resin and compound A (described in Ex. 1 of U.S. Pat. No. 3,635,709) | Ester of 2,3,4-trihydroxybenzophenone and compound B (esterification ratio; 90 mol %) | 2/8 | (b) |
| B-4 | B | Ester of 2,3,4-trihydroxybenzophenone and compound A (esterification ratio; 90 mol %) | Ester of pyrogallol-acetone resin and compound B | 6/4 | (b) |
| B-5 | B | Ester of pyrogallol-acetone resin and compound A (described in Ex. 1 of U.S. Pat. No. 3,635,709) | Ester of N-hydroxy-1,2-cyclohexanedicarboximide and compound B | 8/2 | (c) |

TABLE 2-continued

| Sample No. | Photosensitive composition | (a) Ester of 1,2-naphthoquinone-2-diazide-5-sulfonic acid (hereinafter, 1,2-naphthoquinone-2-diazide-5-sulfonyl chloride is called as compound A) | (b) Ester of 1,2-naphthoquinone-2-diazide-4-sulfonic acid (hereinafter, 1,2-naphthoquinone-2-diazide-4-sulfonyl chloride is called as compound B) | (a)/(b) weight ratio | Polymer |
|---|---|---|---|---|---|
| B-6 | B | Ester of 3,3,3',3'-tetramethyl-1,1'-spirobi-indan-5,6,7,5',6',7'-hexaol and compound A (Photosensitive compound (A) described in Ex. 1 of J. P. KOKAI No. Sho 64-76047) | Ester of 3,3,3',3'-tetramethyl-1,1'-spirobi-indan-5,6,7,5',6',7'-hexaol and compound B | 5/5 | (d) |
| B-7 | B | Ester of reaction product of m-xylenediisocyanate and 4-aminophenol and compound A (described in preparation Example 1 of J. P. KOKAI No. Hei 10-198030) | Ester of pyrogallol-acetone resin and compound B | 6/4 | (e) |
| B-8 | B | Ester of pyrogallol-acetone resin and compound A (described in Ex. 1 of U.S. Pat. No. 3,635,709) | Ester of reaction product of m-xylenediisocyanate and 4-aminophenol and compound B (described in preparation Ex. 2 of J. P. KOKAI No. Hei 10-198030) | 5/5 | (f) |
| B-9 | B | Ester of 2,3,4-trihydroxybenzophenone and compound A (esterification ratio; 90 mol %) | Ester of reaction product of Barnock (バーノック) (Dainippon Ink and Chemicals, Inc.) DN-980S and 4-aminophenol and compound B (described in Ex. 6 of J. P. KOKAI No. Hei 10-198030) | 1/9 | (f) |
| B-10 | B | Ester of 3,3,3',3'-tetramethyl-1,1'-spirobi-indan-5,6,7,5',6',7'-hexaol and compound A (Photosensitive compound (a) described in Ex. 1 of J. P. KOKAI No. Sho 64-76047) | Ester of 2,3,4-trihydroxybenzophenone and compound B (esterification ratio; 90 mol %) | 9/1 | (g) |
| B-11 | B | Ester of pyrogallol-acetone resin and compound A (described in Ex. 1 of U.S. Pat. No. 3,635,709) | Ester of pyrogallol-acetone resin and compound B | 1/9 | (h) |
| C-1 | C | Ester of 2,3,4-trihydroxybenzophenone and compound A (esterification ratio; 90 mol %) | Ester of 2,3,4-trihydroxybenzophenone and compound B (esterification ratio; 90 mol %) | 5/5 | (a) |
| C-2 | C | Ester of 2,3,4-trihydroxybenzophenone and compound A (esterification ratio: 90 mol %) | Ester of N-hydroxy-1,2-cyclohexane-dicarboximide and compound B | 5/5 | (a) |
| C-3 | C | Ester of N-hydroxy-1,2-cyclohexane-dicarboximide and compound A | Ester of pyrogallol-acetone resin and compound B | 8/2 | (b) |
| C-4 | C | Ester of 3,3,3',3'-tetramethyl-1,1'-spirobi-indan-5,6,7,5',6',7'-hexaol and compound A (Photosensitive compound (a) described in Ex. 1 of J. P. KOKAI No. Sho 64-76047) | Ester of 2,3,4-trihydroxybenzophenone and compound B (esterification ratio; 90 mol %) | 5/5 | (c) |
| C-5 | C | Ester of 2,3,4-trihydroxybenzophenone and compound A (esterification ratio; 90 mol %) | Ester of 2,3,4-trihydroxybenzophenone and compound B (esterification ratio; 90 mol %) | 5/5 | (d) |
| C-6 | C | Ester of 2,3,4-trihydroxybenzophenone and compound A (esterification ratio; 90 mol %) | Ester of N-hydroxy-1,2-cyclohexane-dicarboximide and compound B | 6/4 | (e) |
| C-7 | C | Ester of 2,3,4-trihydroxybenzophenone and compound A (esterification ratio; 90 mol %) | Ester of 2,3,4-trihydroxybenzophenone and compound B (esterification ratio; 90 mol %) | 4/6 | (f) |
| C-8 | C | Ester of reaction product of m-xylenediisocyanate and 4-aminophenol and compound A (described in Ex. 1 of J. P. KOKAI No. Hei 10-198030) | Ester of 2,3,4-trihydroxybenzophenone and compound B (esterification ratio; 90 mol %) | 7/3 | (g) |
| C-9 | C | Ester of 2,3,4-trihydroxybenzophenone and compound A (esterification ratio; 90 mol %) | Ester of reaction product of m-xylenediisocyanate and 4-aminophenol and compound B (described in preparation Ex. 2 of J. P. KOKAI No. Hei 10-198030) | 3/7 | (h) |
| B-12 | B | Ester of 2,3,4-trihydroxybenzophenone and compound A (esterification ratio; 90 mol %) | None | 10/0 | (a) |
| C-10 | C | None | Ester of pyrogallol-acetone resin and compound B | 0/10 | (b) |
| B-13 | B | Ester of 2,3,4-trihydroxybenzophenone and compound A (esterification ratio; 90 mol %) | Ester of pyrogallol-acetone resin and compound B | 5/5 | (i) |
| D-1 | D | Ester of 2,3,4-trihydroxybenzophenone and compound A (esterification ratio; 90 mol %) | Ester of pyrogallol-acetone resin and compound B | 5/5 | None |

Each sample in Table 2 was evaluated by the method described below and the results are shown in Table 3.

Printing durability After irradiating the plate with Fuji Film PS light (Toshiba metal halide lamp MU2000-2-Olk, 3 kW) for 50 seconds, the plate was developed by immersing in DP-4 (trade name: Fuji Photo Film Co., Ltd), which was diluted 8 times with water prior to use, at 25° C. for 60 seconds. Then the number of printing copies of each plate was determined using printer KOR (Heiderberg) with a normal ink and UV ink on quality papers.

Sensitivity Each plate was irradiated by Fuji Film PS light (Toshiba metal halide lamp MU2000-2-Olk, 3 kW) and sensitivity of each plate was evaluated by determining the time till the photosensitive layer with the 5th step of gray scale having an optical density difference of 0.15 becomes clear.

Development latitude After irradiating each plate with Fuji Film PS light (Toshiba metal halide lamp MU2000-2-Olk, 3 kW) for 50 seconds, the plate was then immersed in DP-4 (trade name: Fuji Photo Film Co., Ltd), that was diluted 8 times with water prior to use, at 25° C. for 30 seconds and 5 minutes. The change of steps was determined using a gray scale having an optical density difference of 0.15, i.e., (Step number of gray scale after treating for 5 minutes)-(Step number of gray scale after treating for 30 seconds) was determined.

Adaptability to ball-point pen A mark for registration was impressed on each plate with a ball-point pen (Pilot) and developed after 2 minutes. The degree of erosion was determined to evaluate adaptability to ball-point pen. The development was conducted under the same condition as described for evaluation of sensitivity. The symbol "○" is for no erosion on non-image area, "Δ" is for partial erosion on non-image area, and "X" is for erosion of non-image area and exposure of substrate.

Coupling property Each plate was exposed and developed as described above and coupling property was determined by observing red color at halftone The plate without red color was marked with ○, the plate with slight redo color was marked with Δ, and the plate with red color was marked with X.

Change of sensitivity with time Each plate was exposed under the same condition as described above. Then each plate was allowed to stand at 35° C. and 85% of humidity for 16 hours and then developed. The sensitivity of thus treated plate was compared with that of the plate which was developed immediately after exposure. Symbol "○" is for the plate with almost no change in sensitivity and "X" is for the plate by which normal print can not be obtained due to the change of sensitivity. The plate with medium result is expressed as "Δ".

In contrast, positive-working presensitized plate B-12 comprised of photosensitive composition comprising only (a) an ester of 1,2-naphthoquinone-2-diazide-5-sulfonic acid and (c) a polymer which is insoluble in water and soluble in an aqueous alkaline solution and which comprises sulfonamide group shows lower sensitivity and inferior results in adaptability to ball-point pen and coupling property. Also, positive-working presensitized plate C-10 comprised of photosensitive composition comprising only (b) an ester of 1,2-naphthoquinone-2-diazide-4-sulfonic acid and (c) a polymer that is insoluble in water and soluble in an aqueous alkaline solution and which comprises sulfonamide group shows narrow development latitude and wide change of sensitivity after exposure with time.

In addition, the photosensitive composition comprising both (a) ester of 1,2-naphthoquinone-2-diazide-5-sulfonic acid and (b) ester of 1,2-naphthoquinone-2-diazide-4-sulfonic acid but no (c) polymer which is insoluble in water and soluble in an aqueous alkaline solution and which comprises sulfonamide group, urea bond or urethane bond, shows infeior results, especially in printing durability (presensitized plate B-13 and D-1).

The positive-working presensitized plate that comprises on a substrate a positive-working photosensitive composi-

TABLE 3

| Ex. No. | Sample No. | Durability[1] Normal ink | UV ink | Sensitivity[2] | Development latitude | Ball-point pen applicability | Coupling Property | Change of sensitivity with time |
|---|---|---|---|---|---|---|---|---|
| 1 | B-1 | 68000 | 56000 | 50 sec. | 1 step | ○ | ○ | ○ |
| 2 | B-2 | 66000 | 55000 | 50 sec. | 1 step | ○ | ○ | ○ |
| 3 | B-3 | 59000 | 48000 | 50 sec. | 1 step | ○ | ○ | ○ |
| 4 | B-4 | 61000 | 50000 | 55 sec. | 1 step | ○ | ○ | ○ |
| 5 | B-5 | 52000 | 48000 | 60 sec. | 1 step | ○ | ○ | ○ |
| 6 | B-6 | 55000 | 49000 | 60 sec. | 1 step | ○ | ○ | ○ |
| 7 | B-7 | 66000 | 54000 | 55 sec. | 1 step | ○ | ○ | ○ |
| 8 | B-8 | 67000 | 55000 | 55 sec. | 1 step | ○ | ○ | ○ |
| 9 | B-9 | 65000 | 53000 | 50 sec. | 1 step | ○ | ○ | ○ |
| 10 | B-10 | 63000 | 52000 | 55 sec. | 1 step | Δ | ○ | Δ |
| 11 | B-11 | 54000 | 50000 | 50 sec. | 1 step | ○ | ○ | ○ |
| 12 | C-1 | 83000 | 64000 | 50 sec. | 1 step | ○ | ○ | ○ |
| 13 | C-2 | 81000 | 60000 | 50 sec. | 1 step | ○ | ○ | ○ |
| 14 | C-3 | 76000 | 56000 | 60 sec. | 1 step | ○ | ○ | ○ |
| 15 | C-4 | 68000 | 55000 | 60 sec. | 1 step | ○ | ○ | ○ |
| 16 | C-5 | 70000 | 56000 | 60 sec. | 1 step | ○ | ○ | ○ |
| 17 | C-6 | 80000 | 61000 | 55 sec. | 1 step | ○ | ○ | ○ |
| 18 | C-7 | 78000 | 59000 | 60 sec. | 1 step | ○ | ○ | ○ |
| 19 | C-8 | 75000 | 58000 | 55 sec. | 1 step | ○ | Δ | ○ |
| 20 | C-9 | 68000 | 56000 | 50 sec. | 1 step | ○ | ○ | ○ |
| Comp. Ex. 1 | B-12 | 66000 | 55000 | 80 sec. | 1 step | X | X | ○ |
| Comp. Ex. 2 | C-10 | 75000 | 54000 | 55 sec. | 3 steps | ○ | Δ | X |
| Comp. Ex. 3 | B-13 | 51000 | 12000 | 55 sec. | 1 step | ○ | ○ | ○ |
| Comp. Ex. 4 | D-1 | 48000 | 8000 | 50 sec. | 1 step | ○ | ○ | ○ |

[1]Number of normal copies
[2]Suitable time for exposure

As shown in Table 3, positive-working presensitized plates B-1~B-11 and C-1~C-9 comprising (a) ester of 1,2-naphthoquinone-2-diazide-5-sulfonic acid, (b) ester of 1,2-naphthoquinone-2-diazide-4-sulfonic acid and (c) a polymer which is insoluble in water and soluble in an aqueous alkaline solution and which comprises a sulfonamide group, urea bond or urethane bond show good printing durability, chemical-resistant, sensitivity, development latitude, adaptability to ball-point pen and coupling property and also, almost no change of sensitivity after exposure with time was observed.

tion comprising (a) at least one ester of 1,2-naphthoquinone-2-diazide-5-sulfonic acid, (b) at least one ester of 1,2-naphthoquinone-2-diazide-4-sulfonic acid and (c) at least one polymer which is insoluble in water and soluble in an aqueous alkaline solution and which comprises at least one sulfonamide group, urea bond or urethane bond provides a lithographic printing plate which shows wide development latitude, good printing durability, chemical-resistant, coupling property, adaptability to ball-point pen, sensiivity, shelf stability as well as small change of sensitivity after exposure with time.

What is claimed is:

1. A positive-working presensitized plate useful for preparing a lithographic printing plate comprising a positive-working photosensitive composition coated on a substrate, wherein the composition comprises (a) at least one ester of 1,2-naphthoquinone-2-diazide-5-sulfonic acid, (b) at least one ester of 1,2-naphthoquinone-2-diazide-4-sulfonic acid, and (c) at least one polymer which is insoluble in water and soluble in an aqueous alkaline solution and which comprises at least one sulfonamide group.

2. A positive-working presensitized plate useful for preparing a lithographic printing plate comprising a positive-working photosensitive composition coated on a substrate, wherein the composition comprises (a) at least one ester of 1,2-naphthoquinone-2-diazide-5-sulfonic acid, (b) at least one ester of 1,2-naphthoquinone-2-diazide-4-sulfonic acid, and (c) at least one polymer which is insoluble in water and soluble in an aqueous alkaline solution and which comprises at least one urea bond or urethane bond.

3. The presensitized plate of claim 1, wherein the ester compound (a) is an ester of 1,2-naphthoquinone-2-diazide-5-sulfonic acid and a hydroxy compound selected from the group consisting of phenols, resorcin, cresol, pyrogallol, and condensation product thereof with a carbonyl group-containing compound and the ester compound (b) is an ester of 1,2-naphthoquinone-2-diazide-4-sulfonic acid and a hydroxy compound selected from the group consisting of phenols, resorcin, cresol, pyrogallol, and condensation product thereof with a carbonyl group-containing compound.

4. The presensitized plate of claim 2, wherein the ester compound (a) is an ester of 1,2-naphthoquinone-2-diazide-5-sulfonic acid and a hydroxy compound selected from the group consisting of phenols, resorcin, cresol, pyrogallol, and condensation product thereof with a carbonyl group-containing compound and the ester compound (b) is an ester of 1,2-naphthoquinone-2-diazide-4-sulfonic acid and a hydroxy compound selected from the group consisting of phenols, resorcin, cresol, pyrogallol, and condensation product thereof with a carbonyl group-containing compound.

5. The presensitized plate of claim 1, wherein the total amount of ester compounds (a) and (b) ranges from 10% to 50% by weight based on the total weight of solid content of the photosensitive composition.

6. The presensitized plate of claim 2, wherein the total amount of ester compounds (a) and (b) ranges from 10% to 50% by weight based on the total weight of solid content of the photosensitive composition.

7. The presensitized plate of claim 1, wherein the polymer which is insoluble in water and soluble in an aqueous alkaline solution and which comprises at least one sulfonamide group is a copolymer prepared by polymerizing at least one low molecular compound represented by the general formula (Ia) to (Ie);

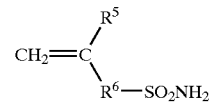 (Ia)

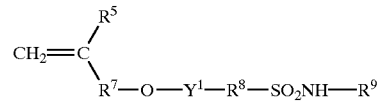 (Ib)

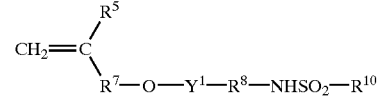 (Ic)

(Id)

(Ie)

wherein, $X^1$ represents —O— or —NR—; $R^1$ represents —H or —CH$_3$; $R^2$ represents optionally substituted $C_1$~$C_{12}$ alkylene, cycloalkylene, arylene or aralkylene group; $R^3$ represents hydrogen atom, or optionally substituted $C_1$~$C_{12}$ alkyl, cycloalkyl, aryl or aralkyl group; $R^4$ represents optionally substituted $C_1$~$C_{12}$ alkyl, cycloalkyl, aryl or aralkyl group; R represents hydrogen atom, or optionally substituted $C_1$~$C_{12}$ alkyl, cycloalkyl, aryl or aralkyl group; $Y^1$ represents single bond or —CO—; $R^5$ represents hydrogen atom, halogen atom or methyl group; $R^6$ represents optionally substituted $C_1$~$C_{12}$ alkylene, cycloalkylene, arylene or aralkylene group; $R^7$ represents single bond or optionally substituted $C_1$~$C_{12}$ alkylene, cycloalkylene, arylene or aralkylene group; $R^8$ represents optionally substituted $C_1$~$C_{12}$ alkylene, cycloalkylene, arylene or aralkylene group; $R^9$ represents hydrogen atom, or optionally substituted $C_1$~$C_{12}$ alkyl, cycloalkyl, aryl or aralkyl group; and $R^{10}$ represents optionally substituted $C_1$~$C_{12}$ alkyl, cycloalkyl, aryl or aralkyl group.

8. The presensitized plate of claim 2, wherein the polymer which is insoluble in water and soluble in an aqueous alkaline solution and which comprises at least one urea bond or urethane bond is a copolymer comprising at least one repeating unit represented by the general formula (IIa) to (IIc);

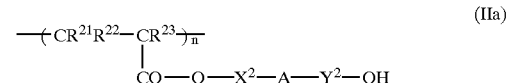 (IIa)

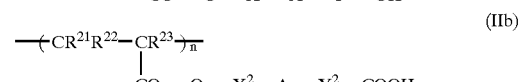 (IIb)

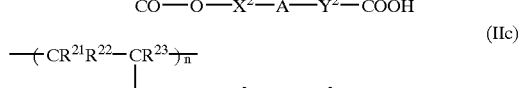 (IIc)

wherein, $R^{21}$ and $R^{22}$ each independently represents hydrogen atom, halogen atom, alkyl, aryl, or carboxyl group, or salts thereof, $R^{23}$ represents hydrogen atom, halogen atom, alkyl or aryl group, "A" represents —NHCONH—, —NHCOO—, or —OCONH—, $X^2$ represents bivalent connecting group, and $Y^2$ represents optionally substituted bivalent aromatic group.

* * * * *